United States Patent
Tran et al.

(10) Patent No.: US 12,075,618 B2
(45) Date of Patent: *Aug. 27, 2024

(54) INPUT AND DIGITAL OUTPUT MECHANISMS FOR ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US); Stephen Trinh, San Jose, CA (US); Stanley Hong, San Jose, CA (US); Toan Le, Ho Chi Minh (VN); Nghia Le, Ho Chi Minh (VN); Hien Pham, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 705 days.

This patent is subject to a terminal disclaimer.

(21) Appl. No.: 17/133,395

(22) Filed: Dec. 23, 2020

(65) Prior Publication Data

US 2021/0118894 A1  Apr. 22, 2021

Related U.S. Application Data

(63) Continuation-in-part of application No. 16/919,697, filed on Jul. 2, 2020, now Pat. No. 11,482,530, which (Continued)

(51) Int. Cl.
*H10B 41/42* (2023.01)
*G06N 3/08* (2023.01)
(Continued)

(52) U.S. Cl.
CPC ............... *H10B 41/42* (2023.02); *G06N 3/08* (2013.01); *G11C 16/0425* (2013.01); *H01L 29/7883* (2013.01)

(58) Field of Classification Search
CPC ........... H01L 27/11531; H01L 29/7883; H01L 29/42344; G06N 3/08; G06N 3/0454;
(Continued)

(56) References Cited

U.S. PATENT DOCUMENTS

| 5,029,130 A | 7/1991 | Yeh |
| 6,205,556 B1 | 3/2001 | Watanabe |

(Continued)

FOREIGN PATENT DOCUMENTS

| CN | 102089827 A | 6/2011 |
| CN | 110 728 358 | 1/2020 |

(Continued)

OTHER PUBLICATIONS

Hideo Kosaka, et al., "An Excellent Weight-Updating-Linearity EEPROM Synapse Memory Cell for Self-Learning Neuron-MOS Neural Networks," IEEE Transactions on Electron Devices, vol. 41, No. 1, Jan. 31, 1995, pp. 135-143.

(Continued)

*Primary Examiner* — Caleen O Sullivan
(74) *Attorney, Agent, or Firm* — DLA PIPER LLP US

(57) ABSTRACT

Numerous embodiments for reading or verifying a value stored in a selected memory cell in a vector-by-matrix multiplication (VMM) array in an artificial neural network are disclosed. In one embodiment, an input comprises a set of input bits that result in a series of input signals applied to a terminal of the selected memory cell, further resulting in a series of output signals that are digitized, shifted based on the bit location of the corresponding input bit in the set of (Continued)

input bits, and added to yield an output indicating a value stored in the selected memory cell.

22 Claims, 42 Drawing Sheets

Related U.S. Application Data is a continuation of application No. 16/231,231, filed on Dec. 21, 2018, now Pat. No. 10,741,568.

(60) Provisional application No. 62/746,470, filed on Oct. 16, 2018.

(51) Int. Cl.
*G11C 16/04* (2006.01)
*H01L 29/788* (2006.01)

(58) Field of Classification Search
CPC .. G06N 3/0481; G06N 3/0635; G06N 3/0445; G11C 16/0425; G11C 2211/5621; G11C 11/54; G11C 11/5628; G11C 27/005; G11C 11/5642
USPC ........................................ 438/257
See application file for complete search history.

(56) References Cited

U.S. PATENT DOCUMENTS

| | | |
|---|---|---|
| 6,747,310 B2 | 6/2004 | Fan et al. |
| 8,681,563 B1 | 3/2014 | Lee et al. |
| 11,482,530 B2 | 10/2022 | Tran |
| 11,507,642 B2 | 11/2022 | Tran et al. |
| 2002/0163838 A1 | 11/2002 | Guterman |
| 2005/0162916 A1 | 7/2005 | Guterman et al. |
| 2006/0291285 A1 | 12/2006 | Mokhlesi et al. |
| 2007/0050583 A1 | 3/2007 | Nishimura |
| 2008/0084752 A1 | 4/2008 | Li |
| 2008/0106944 A1 | 5/2008 | Kim et al. |
| 2010/0039859 A1 | 2/2010 | Mokhlesi |
| 2011/0273935 A1 | 11/2011 | Dong |
| 2016/0149567 A1 | 5/2016 | Matsuzaki et al. |
| 2017/0110194 A1 | 4/2017 | Tiwari |
| 2017/0337466 A1 | 11/2017 | Bayat et al. |
| 2019/0164617 A1 | 5/2019 | Tran |
| 2019/0287621 A1 | 9/2019 | Tran |
| 2020/0133989 A1 | 4/2020 | Song |
| 2020/0159495 A1 | 5/2020 | Joo |
| 2020/0167632 A1 | 5/2020 | Kim |

FOREIGN PATENT DOCUMENTS

| | | |
|---|---|---|
| JP | h10-106276 | 4/1998 |
| JP | 2006-509326 | 3/2006 |
| JP | 2009-537055 | 10/2009 |
| KR | 10-1030617 | 4/2011 |
| TW | 270192 B | 2/1996 |
| TW | 200822120 A | 5/2008 |
| WO | 2000/62301 A1 | 10/2000 |
| WO | 2017 200883 A1 | 11/2017 |
| WO | 2018/057766 A1 | 3/2018 |

OTHER PUBLICATIONS

Richard Blum, "An Electronic System for Extracellular Neural Stimulation and Recording," pp. 70-91, Aug. 31, 2007, retrieved on Aug. 19, 2014, from URL:https://smartech.gatech.edu/bitstream/handle/1853/16192/blum_richard_a_200708_phd.pdf.
M. Reza Mahmoodi, et al., "Breaking Pops/J Barrier with Analog Multiplier Circuits Based on Nonvolatile Memories," Proceeding of the International Symposium on Low Power Electronics and Design, ISLPED '18, Jul. 23, 2018, pp. 1-6.
Xinjie Guo, "Mixed Signal Neurocomputing Based on Floating-gate Memories," pp. 1-106, Mar. 31, 2017, retrieved on Oct. 1, 2019 from URL:https://www.alexandria.ucsb.edu/lib/ark:48907/f3jh3mb0. Parts 1 and 2.
European Extended Search Report mailed on May 2, 2023 corresponding to the related European Patent Application No. 23156869.2.
Japanese Office Action dated Jun. 27, 2023 corresponding to the related Japanese Patent Application No. 2021-520973.
Taiwanese Search Report dated May 20, 2022 corresponding to the related Taiwanese Patent Application No. 110144304.
PCT Search Report corresponding to the related PCT US21/022855.
Office Action dated Feb. 17, 2021 from the related Taiwanese Patent Application No. 108136072.
PCT International Preliminary Report from the related PCT Patent Application No. US2019/043524.
Korean Office Action mailed on Feb. 5, 2024 corresponding to the related S. Korean Patent Application No. 10-2022-7004070.
European Examination Report mailed on Mar. 11, 2024 corresponding to the related European Patent Application No. 23 156 869.2.
Pai-Yu Chen, "Design of Resistive Synaptic Devices and Array Architectures for Neuromorphic Computing," pp. 1-146, May 2018, Arizona State University.
European Examination Report mailed on May 31, 2024 corresponding to the related European Patent Application No. 21 718 319.3.
S. Korean Office Action mailed on May 7, 2024 corresponding to the related S. Korean Patent Application No. 10-2023-7015477.

INPUT AND DIGITAL OUTPUT MECHANISMS FOR ANALOG NEURAL MEMORY IN A DEEP LEARNING ARTIFICIAL NEURAL NETWORK

PRIORITY CLAIM

This application is a continuation-in-part of U.S. patent application Ser. No. 16/919,697, filed on Jul. 2, 2020, and tiled, "Precision Tuning for the Programming of Analog Neural Memory in a Deep Learning Artificial Neural Network," which is a continuation of U.S. patent application Ser. No. 16/231,231, filed on Dec. 21, 2018, and titled, "Precision Tuning for the Programming of Analog Neural Memory in a Deep Learning Artificial Neural Network," which claims priority to U.S. Provisional Patent Application No. 62/746,470, filed on Oct. 16, 2018, and titled "Precision Tuning For the Programming Of Analog Neural Memory In A Deep Learning Artificial Neural Network," all of which are incorporated by reference herein.

FIELD OF THE INVENTION

Numerous embodiments are disclosed of input and output mechanisms for reading or verifying a non-volatile memory cell within a vector-by-matrix multiplication (VMM) array in an artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

Because the outputs of one VMM often will need to be applied to another VMM, it is desirable in VMM systems to be able to convert an output of a VMM into bits and to apply input bits to another VMM. A challenge then emerges as to how to best implement the bit coding mechanism for the VMM system.

What is needed are improved programming, verifying, and reading systems and methods utilizing input bits and output bits suitable for use with a VMM in an analog neuromorphic memory system.

SUMMARY OF THE INVENTION

Numerous embodiments for reading or verifying a value stored in a selected memory cell in a vector-by-matrix multiplication (VMM) array in an artificial neural network are disclosed. In one embodiment, an input comprises a set of input bits that result in a series of input signals applied to a terminal of the selected memory cell, further resulting in a series of output signals that are digitized, shifted based on the bit location of the corresponding input bit in the set of input bits, and added to yield an output indicating a value stored in the selected memory cell.

DETAILED DESCRIPTION OF THE INVENTION

The artificial neural networks of the present invention utilize a combination of CMOS technology and non-volatile memory arrays.

Non-Volatile Memory Cells

Figure 1:
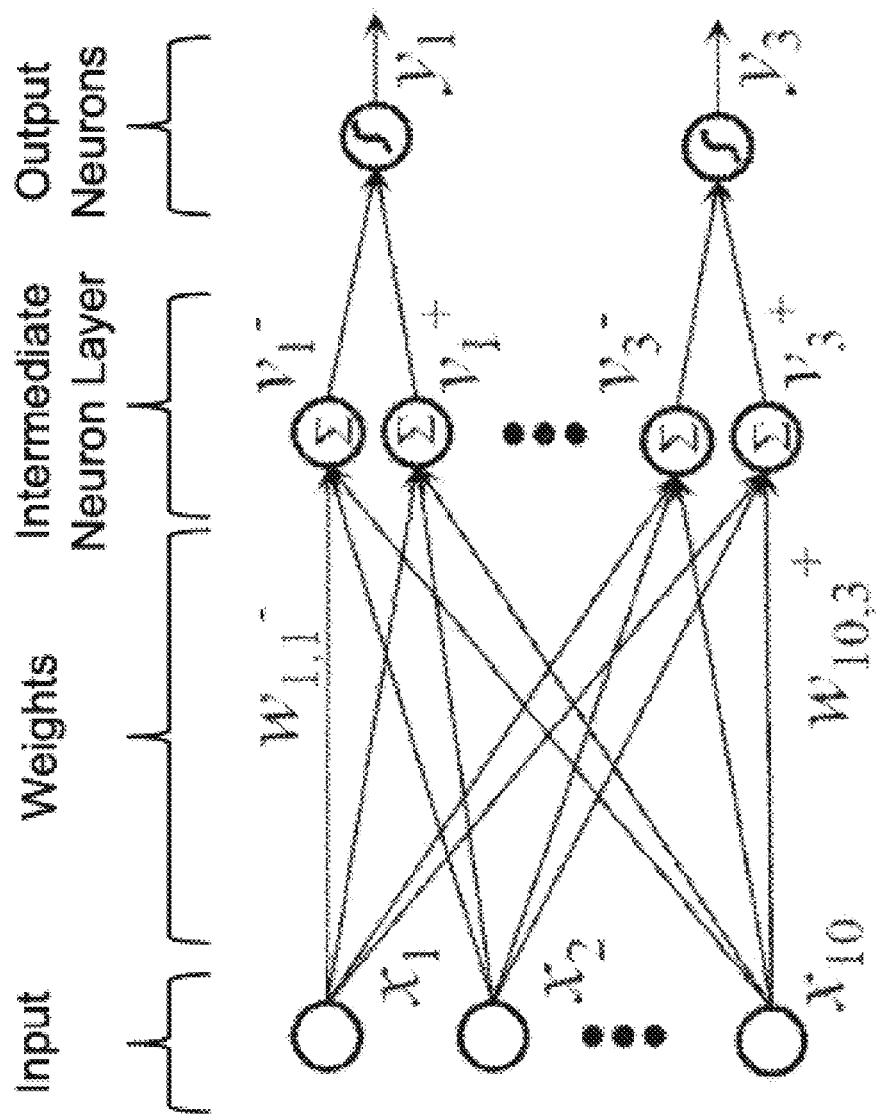
FIG. 1 is a diagram that illustrates an artificial neural network.
Figure 2:
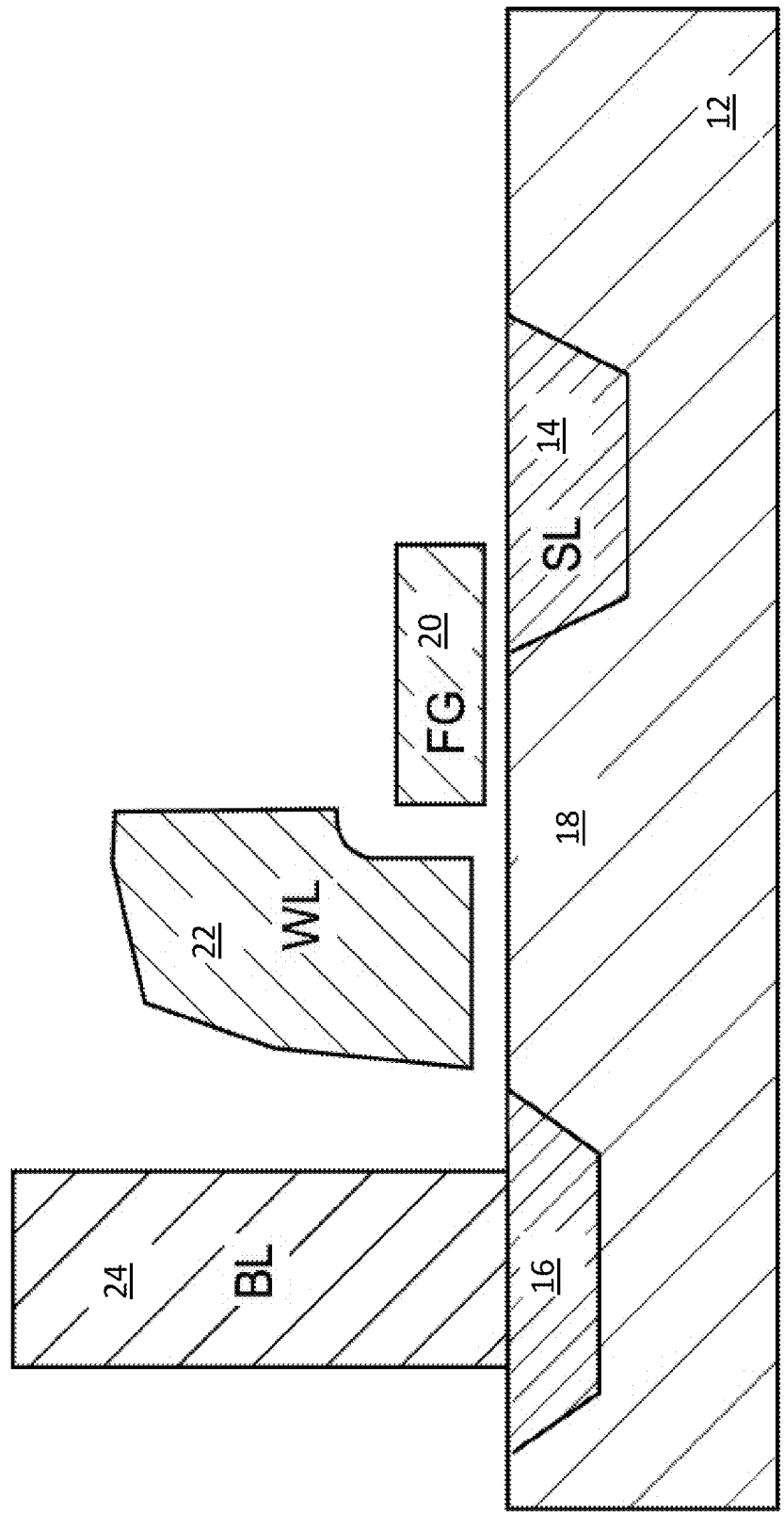
FIG. 2 depicts a prior art split gate flash memory cell.

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Figure 3:
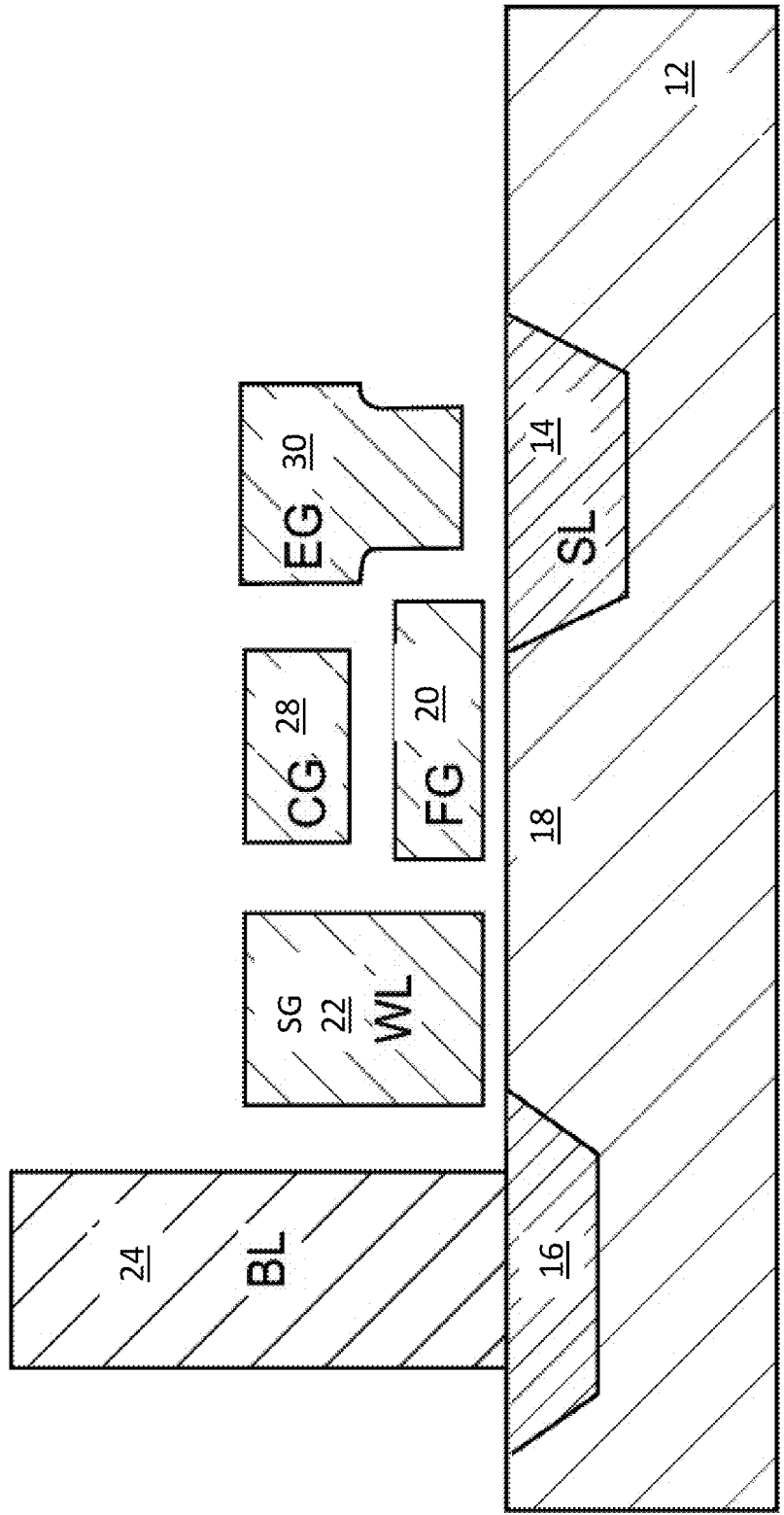
FIG. 3 depicts another prior art split gate flash memory cell.

Operation of Flash Memory Cell 210 of FIG. 3

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 μA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | -0.5 V/0 V | 0 V | 0 V/-8 V | 8-12 V | 0 V |
| Program | 1 V | 1 μA | 8-11 V | 4.5-9 V | 4.5-5 V |

Figure 4:
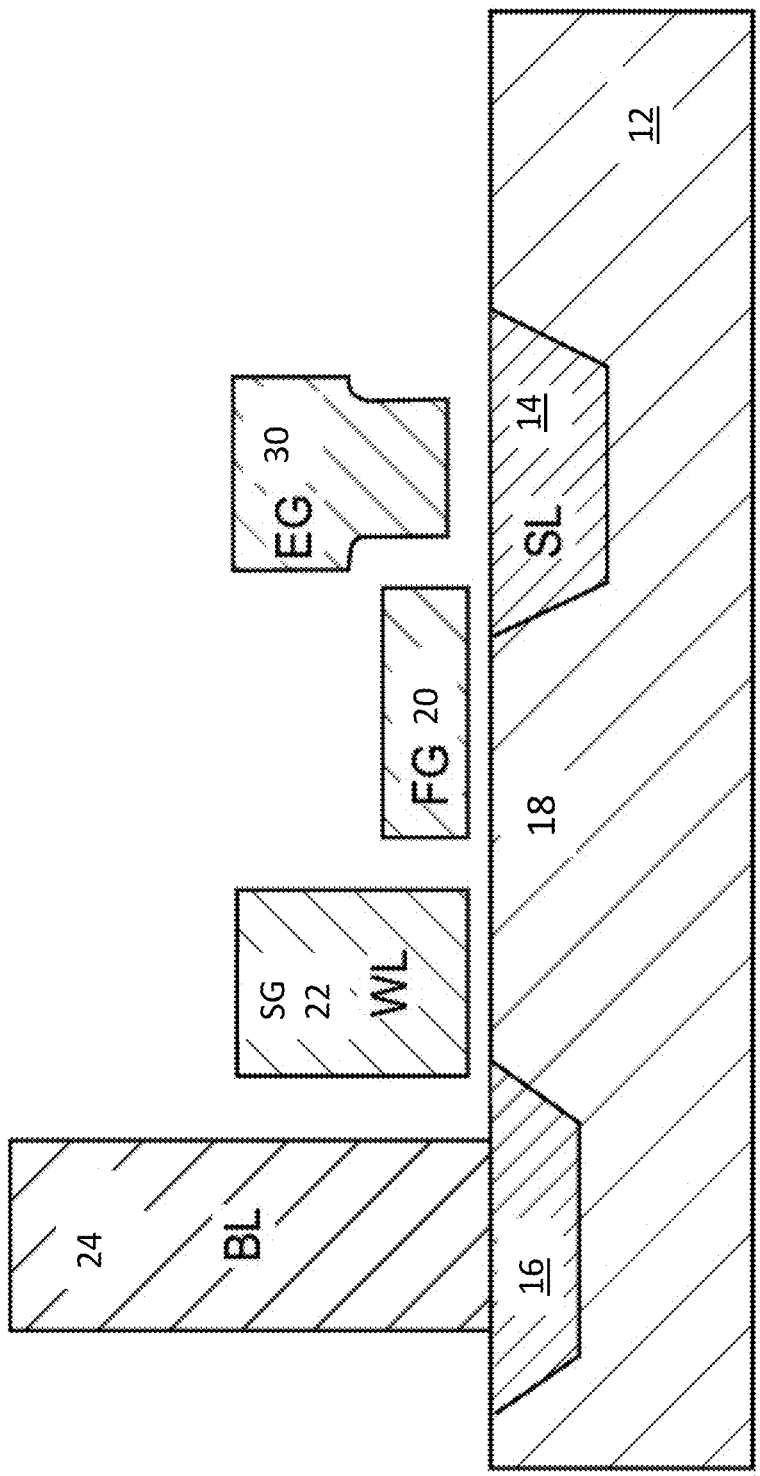
FIG. 4 depicts another prior art split gate flash memory cell.

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 410 for performing read, erase, and program operations:

TABLE NO. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | -0.5 V/0 V | 0 V | 11.5 V | 0 V |
| Program | 1 V | 2-3 μA | 4.5 V | 7-9 V |

Figure 5:
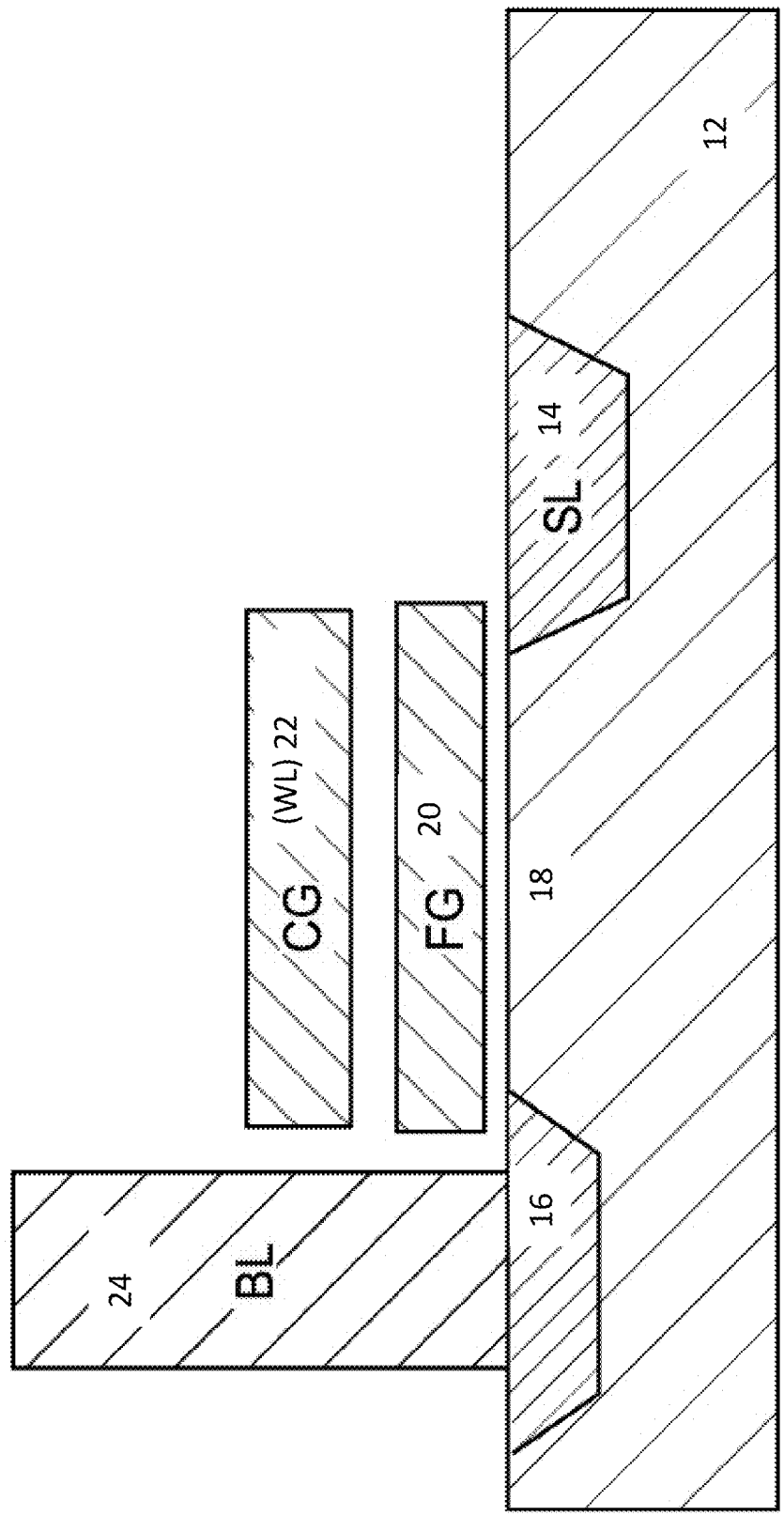
FIG. 5 depicts another prior art split gate flash memory cell.

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 510 and substrate 12 for performing read, erase, and program operations:

TABLE NO. 4

Operation of Flash Memory Cell 510 of FIG. 5

|  | CG | BL | SL | Substrate |
|---|---|---|---|---|
| Read | 2-5 V | 0.6-2 V | 0 V | 0 V |
| Erase | -8 to -10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
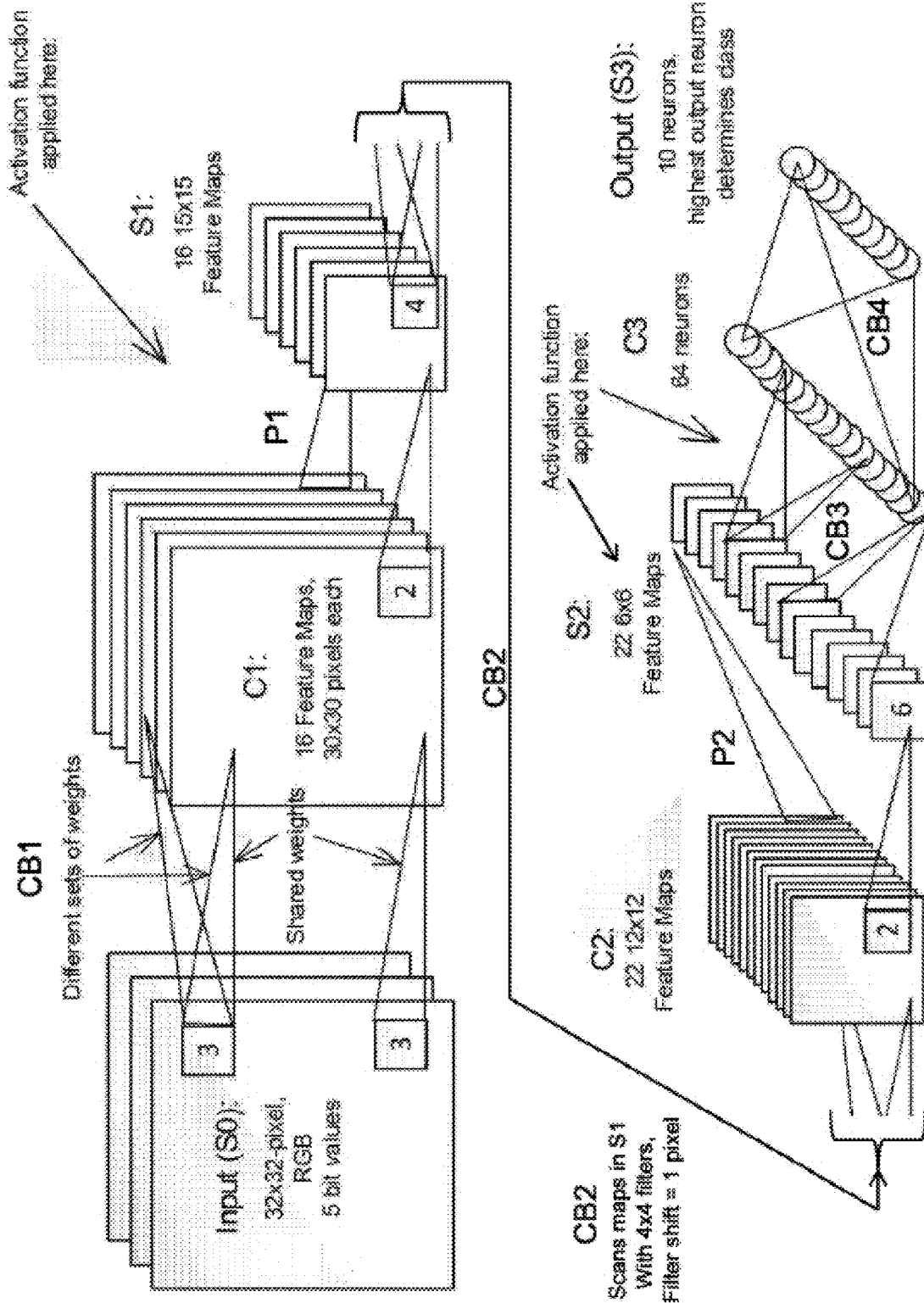
FIG. 6 is a diagram illustrating the different levels of an exemplary artificial neural network utilizing one or more non-volatile memory arrays.

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 7:
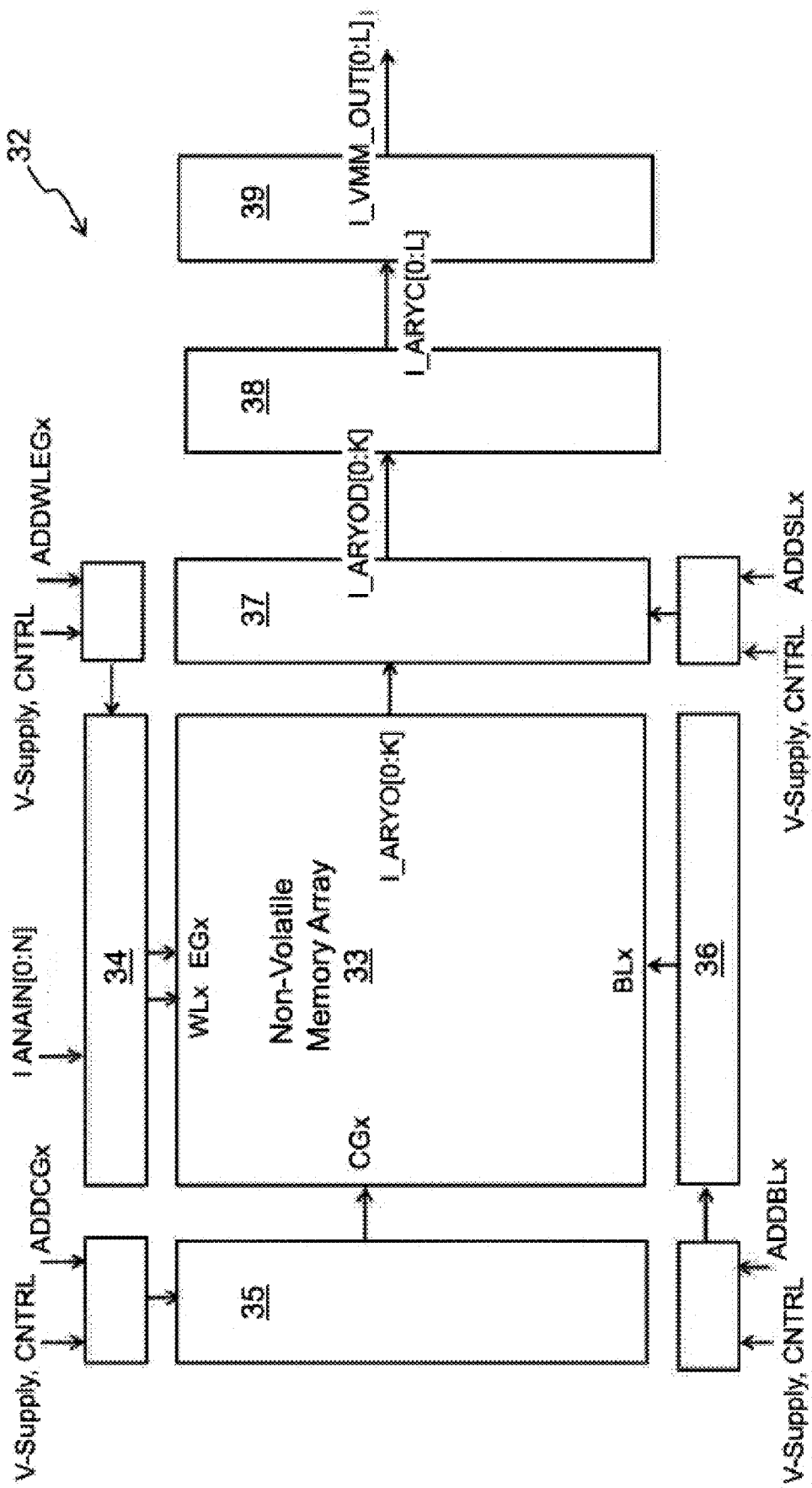
FIG. 7 is a block diagram illustrating a vector-by-matrix multiplication system.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tanh, or ReLU functions. The rectified output values of activation function circuit 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function circuit 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

Figure 8:
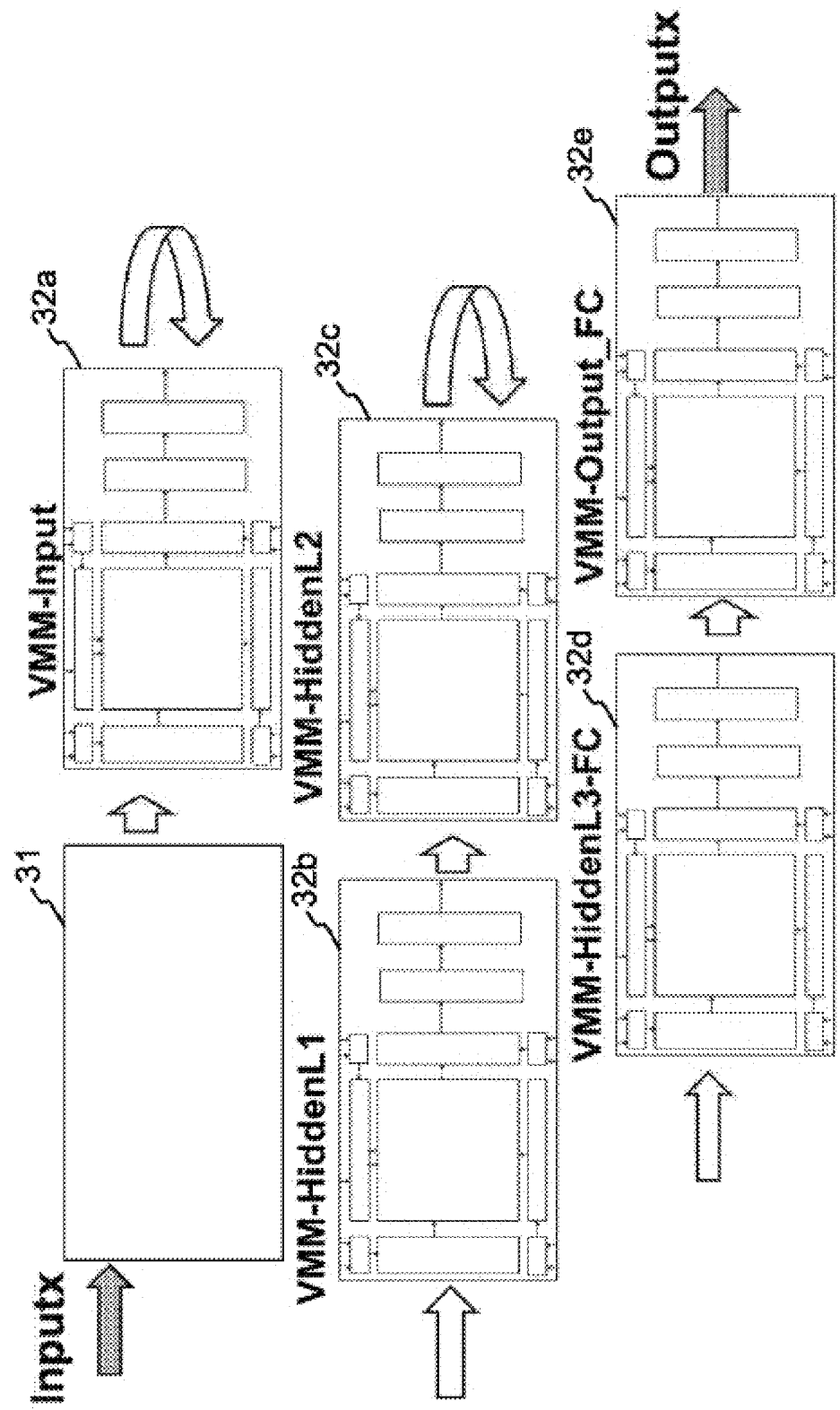
FIG. 8 is a block diagram illustrates an exemplary artificial neural network utilizing one or more a vector-by-matrix multiplication systems.

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31, and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
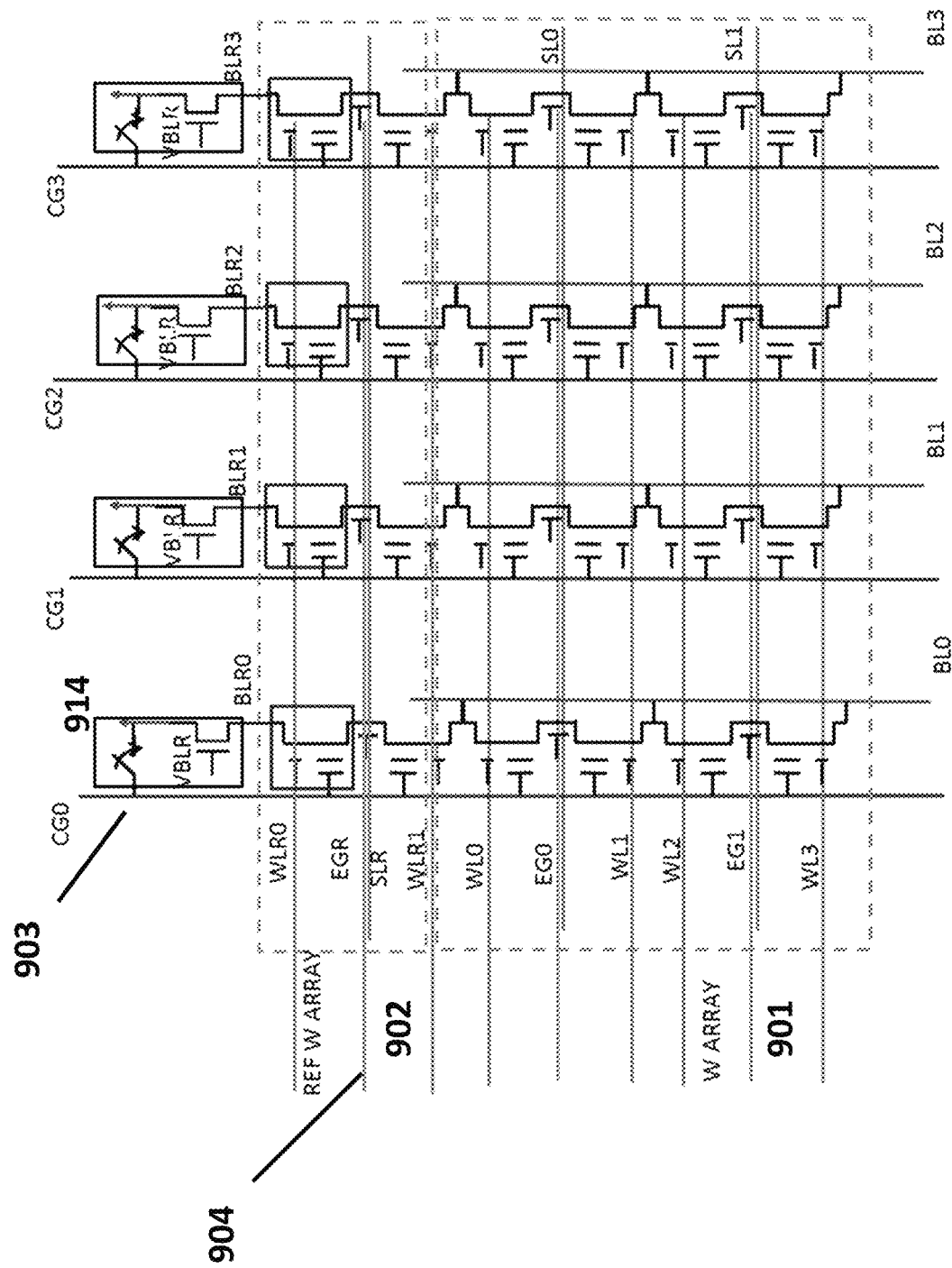
FIG. 9 depicts another embodiment of a vector-by-matrix multiplication system.

FIG. 9 depicts neuron VMM array 900, which is particularly suited for memory cells 310 as shown in FIG. 3, and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the flash memory of VMM array 900, are preferably configured to operate in a sub-threshold region.

The non-volatile reference memory cells and the non-volatile memory cells described herein are biased in weak inversion:

$$Ids = Io * e^{(Vg-Vth)/kVt} = w * Io * e^{(Vg)/kVt},$$

where $w = e^{(-Vth)/kVt}$

For an I-to-V log converter using a memory cell (such as a reference memory cell or a peripheral memory cell) or a transistor to convert input current into an input voltage:

$$Vg = k*Vt*\log [Ids/wp*Io]$$

Here, wp is w of a reference or peripheral memory cell.

For a memory array used as a vector matrix multiplier VMM array, the output current is:

$$Iout = wa*Io*e^{(Vg)/kVt}, \text{ namely}$$

$$Iout = (wa/wp)*Iin = W*Iin$$

$$W = e^{(Vthp-Vtha)/kVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids = \text{beta}*(Vgs-Vth)*Vds; \text{ beta} = u*Cox*W/L$$

$$W = \alpha(Vgs-Vth)$$

A wordline or control gate or bitline or sourceline can be used as the input for the memory cell operated in the linear region.

For an I-to-V linear converter, a memory cell (such as a reference memory cell or a peripheral memory cell) or a transistor operating in the linear region can be used to linearly convert an input/output current into an input/output voltage.

Other embodiments for VMM array 32 of FIG. 7 are described in U.S. patent application Ser. No. 15/826,345, which is incorporated by reference herein. As described in that application, a sourceline or a bitline can be used as the neuron output (current summation output).

Figure 10:
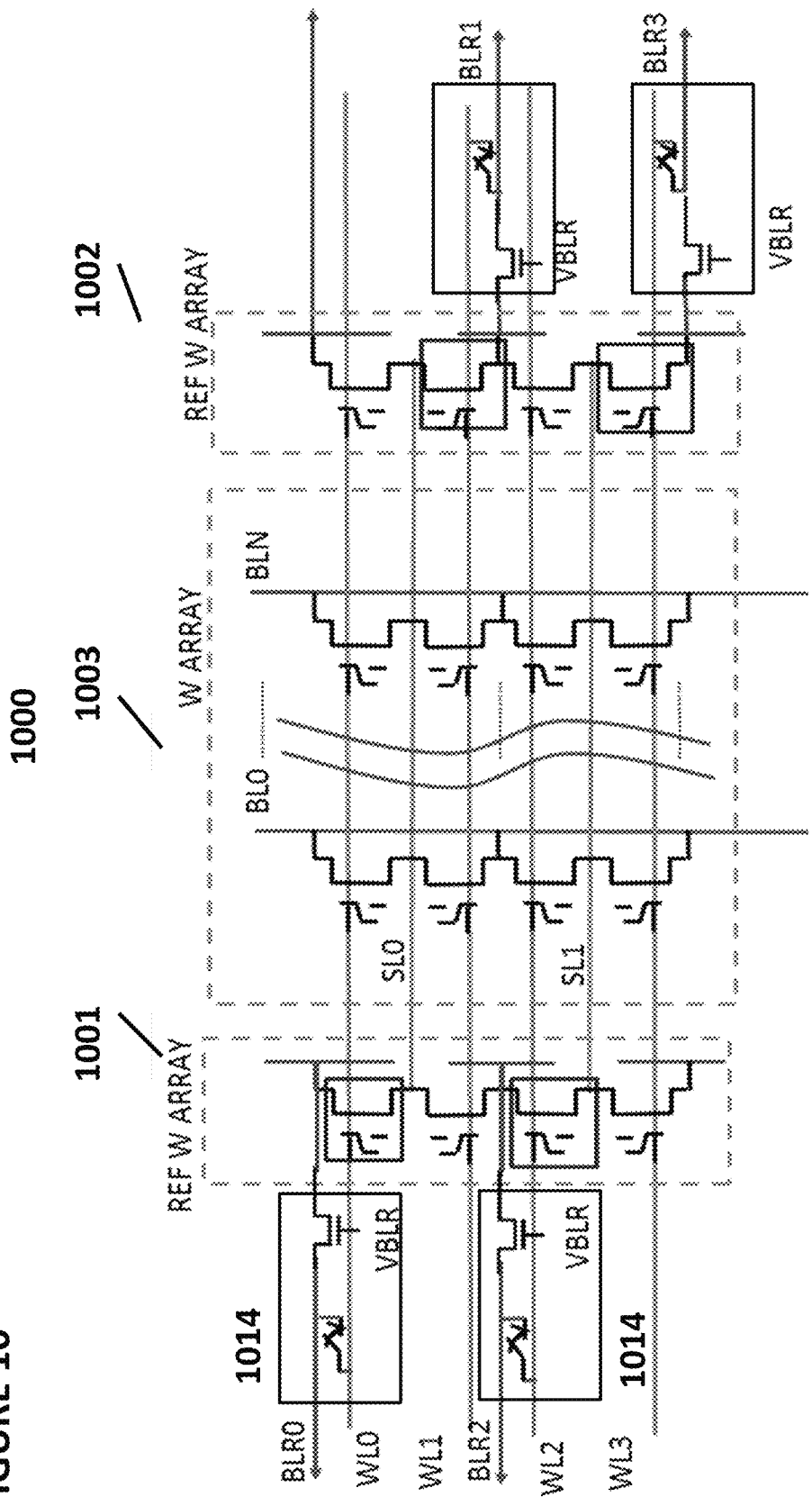
FIG. 10 depicts another embodiment of a vector-by-matrix multiplication system.

FIG. 10 depicts neuron VMM array 1000, which is particularly suited for memory cells 210 as shown in FIG. 2, and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No. 5

Operation of VMM Array 1000 of FIG. 10:

|  | WL | WL -unsel | BL | BL -unsel | SL | SL -unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 11:
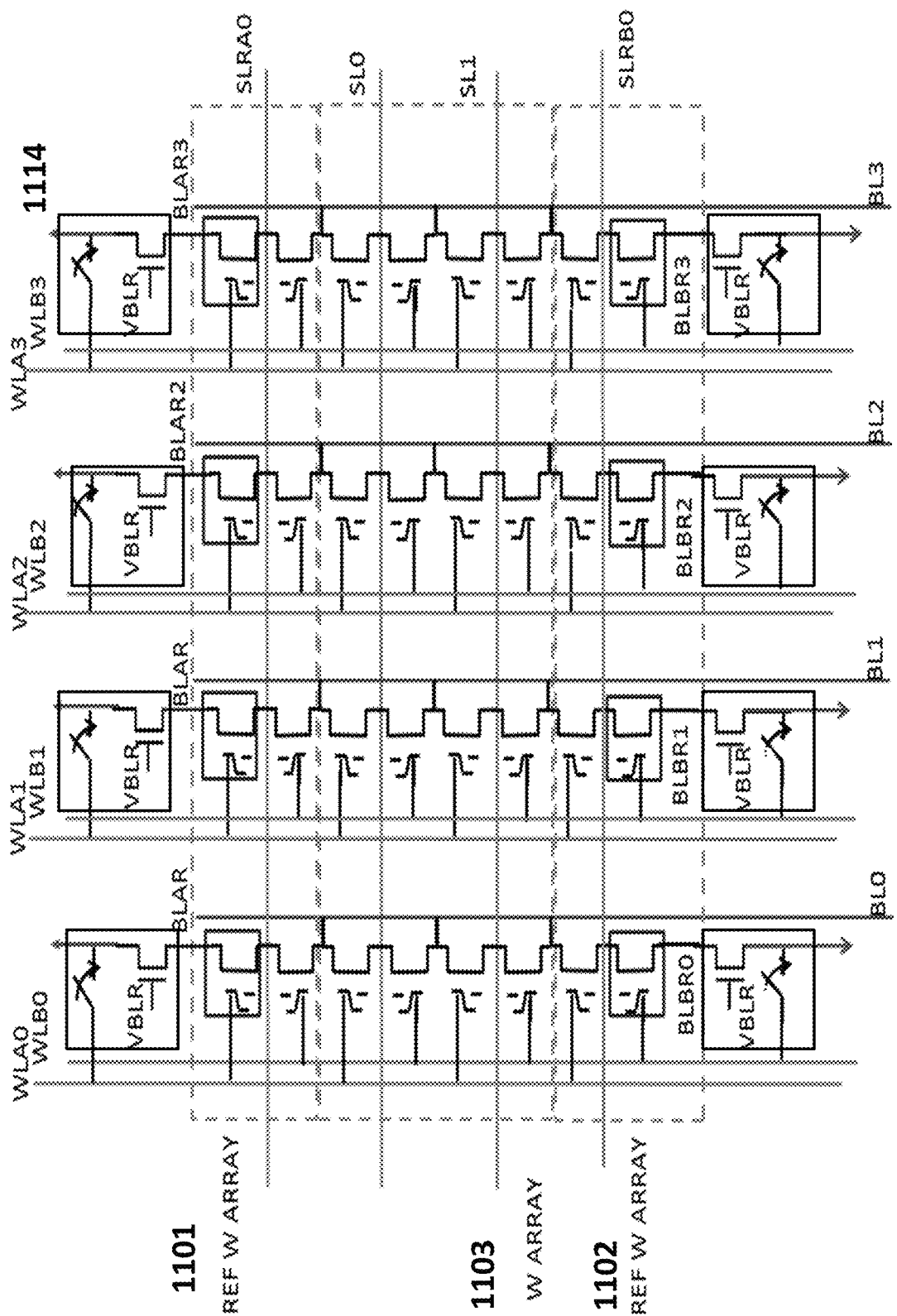
FIG. 11 depicts another embodiment of a vector-by-matrix multiplication system.

FIG. 11 depicts neuron VMM array 1100, which is particularly suited for memory cells 210 as shown in FIG. 2, and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No. 6

Operation of VMM Array 1100 of FIG. 11

|  | WL | WL -unsel | BL | BL -unsel | SL | SL -unsel |
|---|---|---|---|---|---|---|
| Read | 1-3.5 V | −0.5 V/0 V | 0.6-2 V | 0.6 V-2 V/0 V | −0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 12:
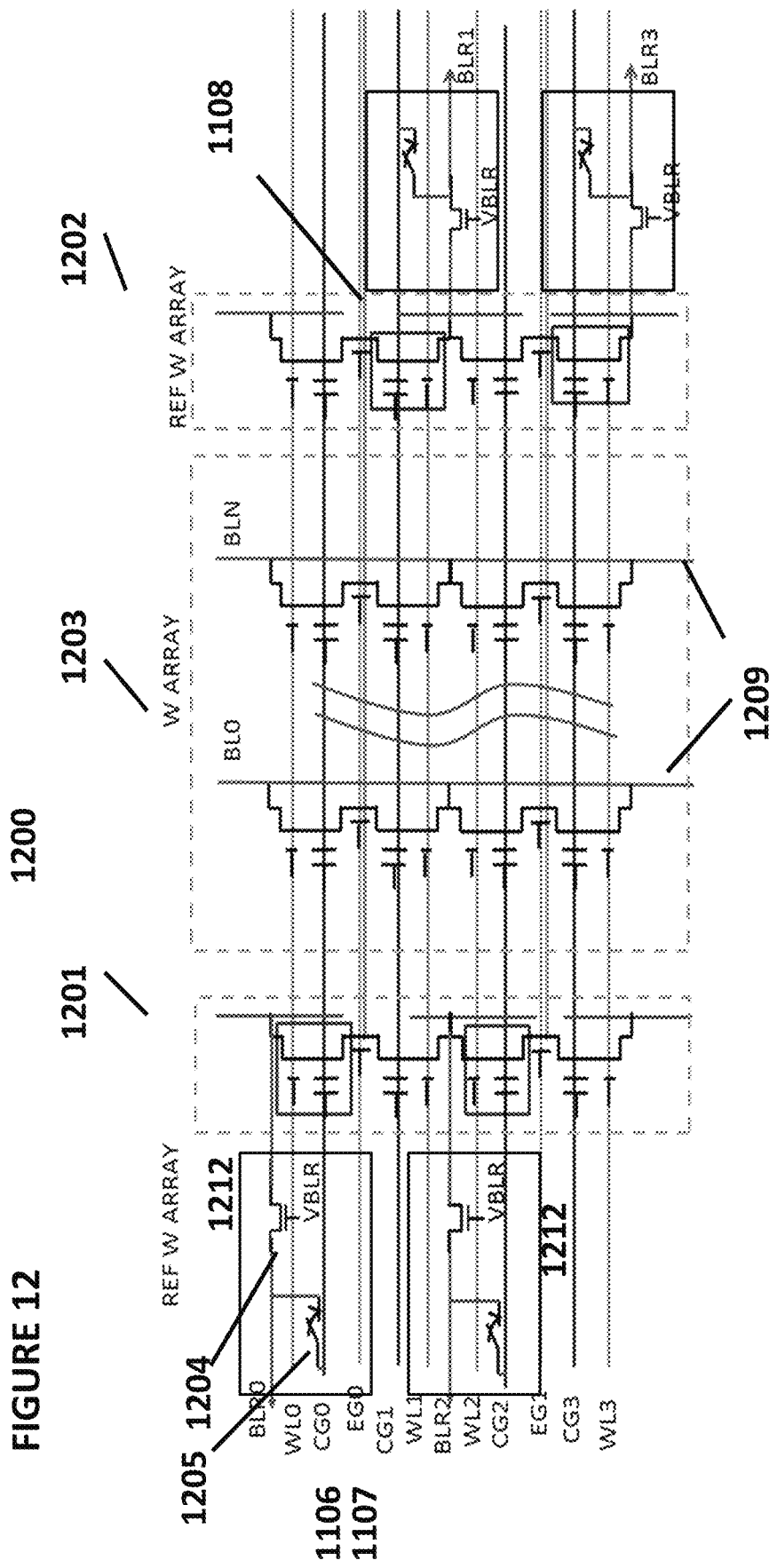
FIG. 12 depicts another embodiment of a vector-by-matrix multiplication system.

FIG. 12 depicts neuron VMM array 1200, which is particularly suited for memory cells 310 as shown in FIG. 3, and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. This can be performed, for example, using the novel precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No. 7

Operation of VMM Array 1200 of FIG. 12

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 13:
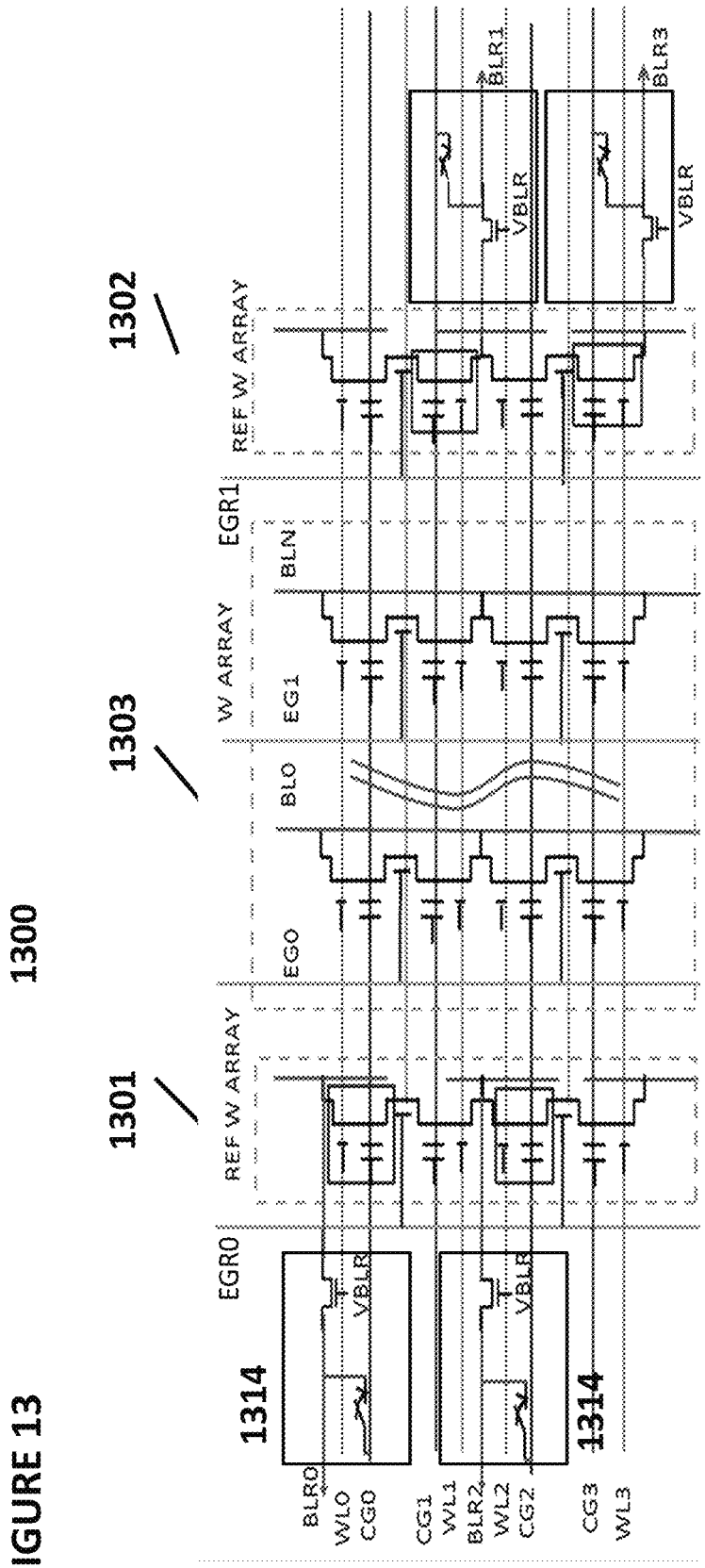
FIG. 13 depicts another embodiment of a vector-by-matrix multiplication system.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 14:
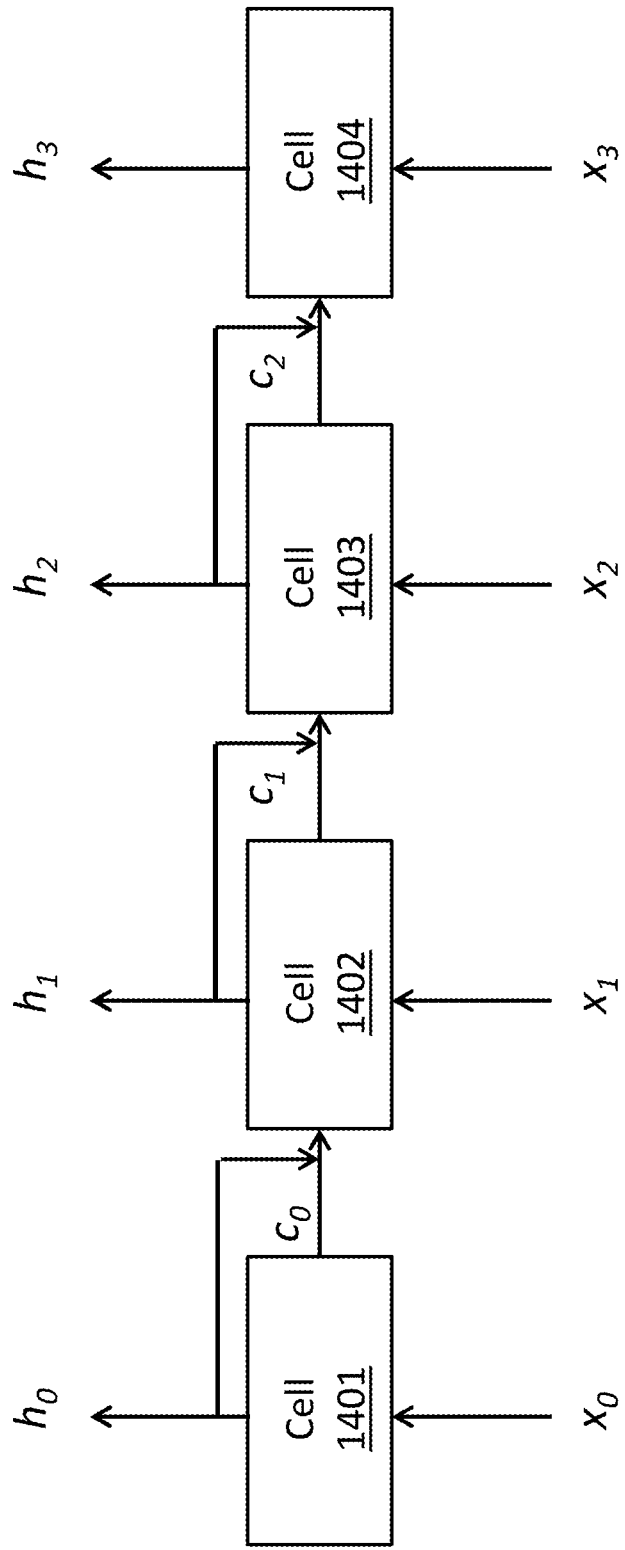
FIG. 14 depicts a prior art long short term memory system.

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output, vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

Figure 15:
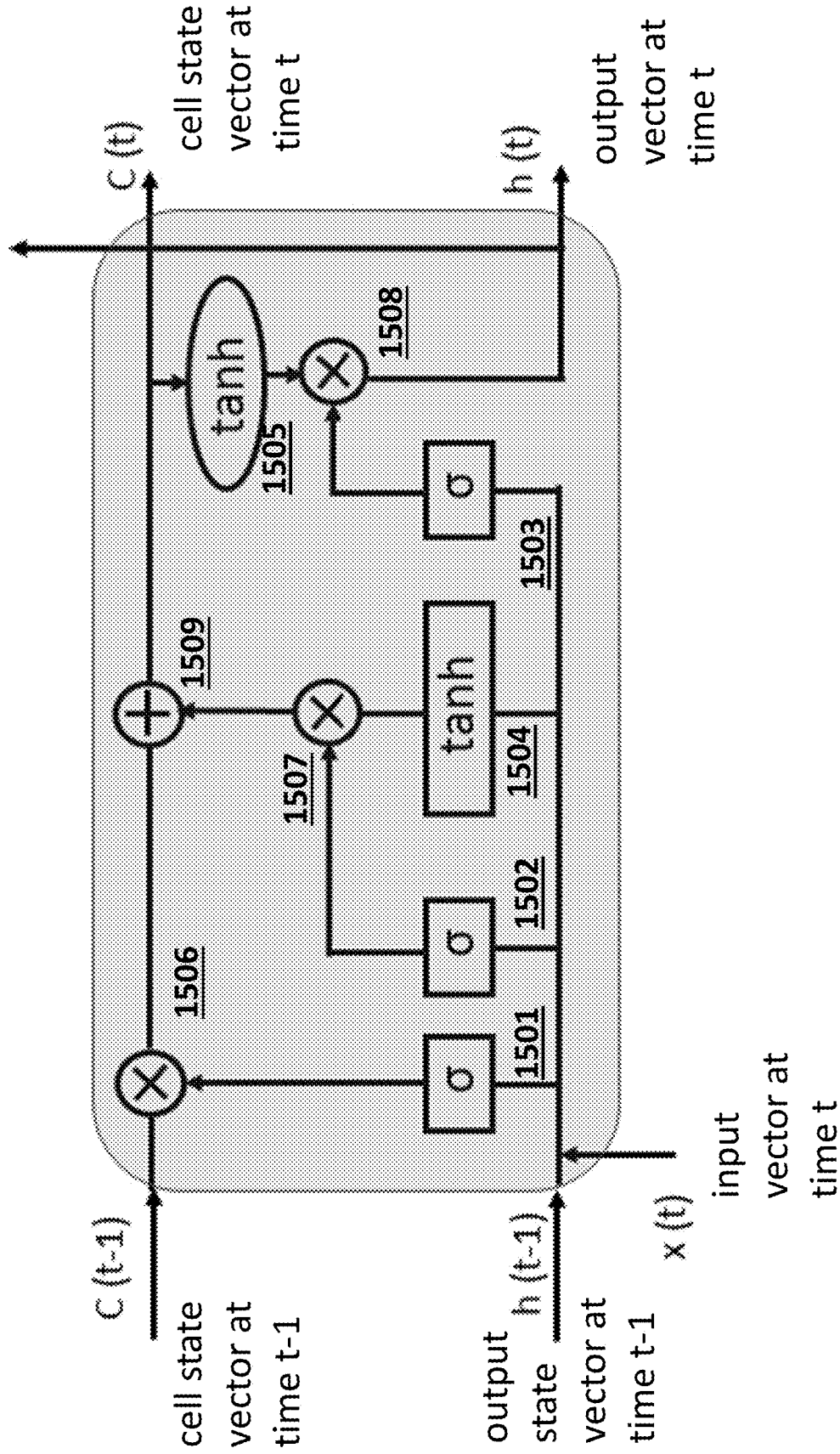
FIG. 15 depicts an exemplary cell for use in a long short term memory system.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tanh devices 1504 and 1505 to apply a hyperbolic tangent function to an input vector, multiplier devices 1506, 1507, and 1508 to multiply two TABLE No. 8

Operation of VMM Array 1300 of FIG. 13

|  | WL | WL - unsel | BL | BL-unsel | CG | CG -unsel same sector | CG-unsel | EG | EG-unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0V | 0.1-1 uA | Vinh (1-2 V) | 4-11 V | 0-2.6 V | 0-2.6 V | 4.5-5 V | 0-2.6 V | 4.5-5 V | 0-1 V |

Long Short-Term Memory

The prior art includes a concept known as long short-term memory (LSTM). LSTM units often are used in neural networks. LSTM allows a neural network to remember information over predetermined arbitrary time intervals and vectors together, and addition device 1509 to add two vectors together. Output vector h(t) can be provided to the next LSTM cell in the system, or it can be accessed for other purposes.

Figure 16:
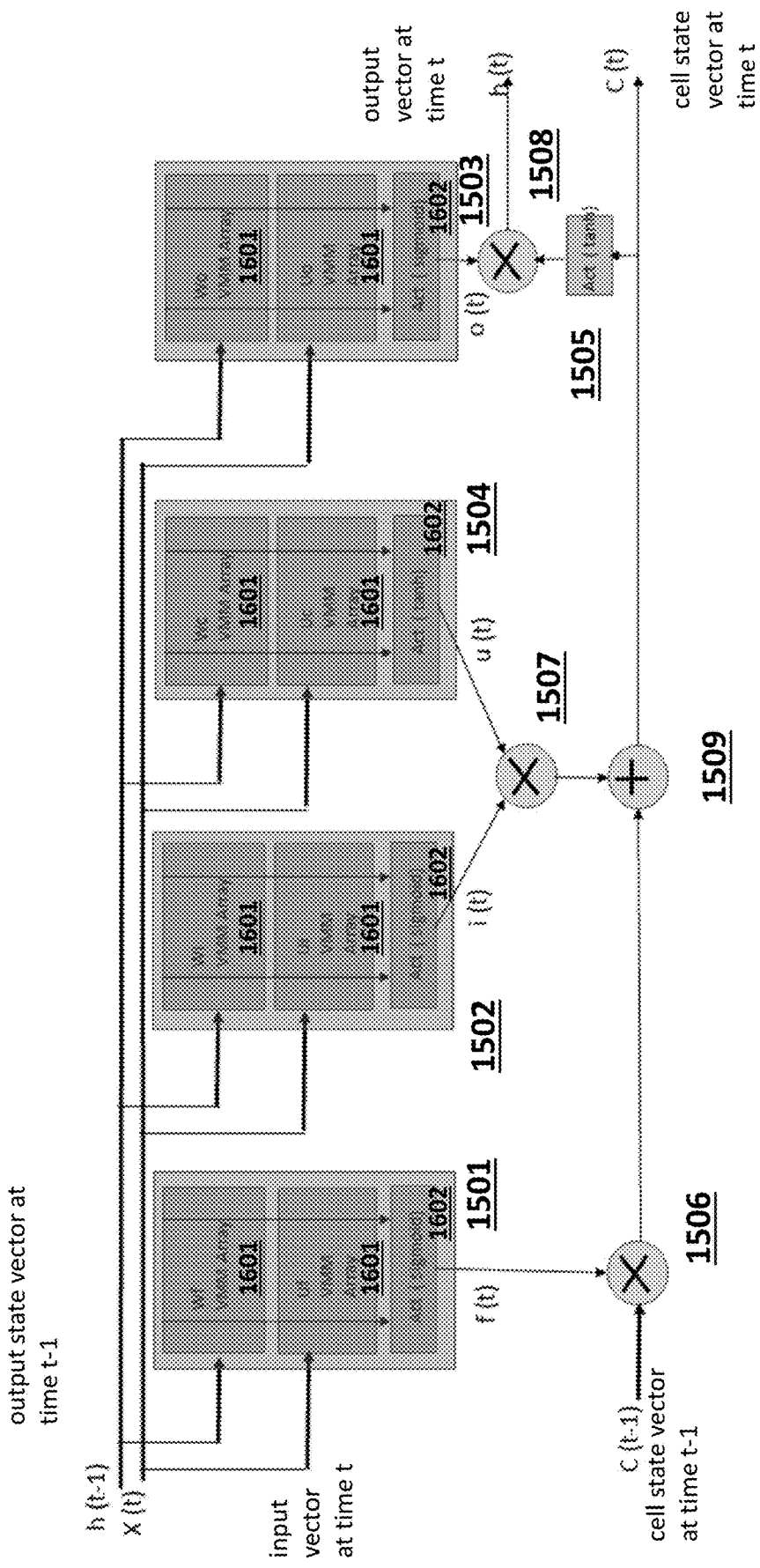
FIG. 16 depicts an embodiment of the exemplary cell of FIG. 15.

FIG. 16 depicts an LSTM cell 1600, which is an example of an implementation of LSTM cell 1500, For the reader's convenience, the same numbering from LSTM cell 1500 is used in LSTM cell 1600. Sigmoid function devices 1501, 1502, and 1503 and tanh device 1504 each comprise multiple VMM arrays 1601 and activation circuit blocks 1602, Thus, it can be seen that VMM arrays are particular useful in LSTM cells used in certain neural network systems.

Figure 17:
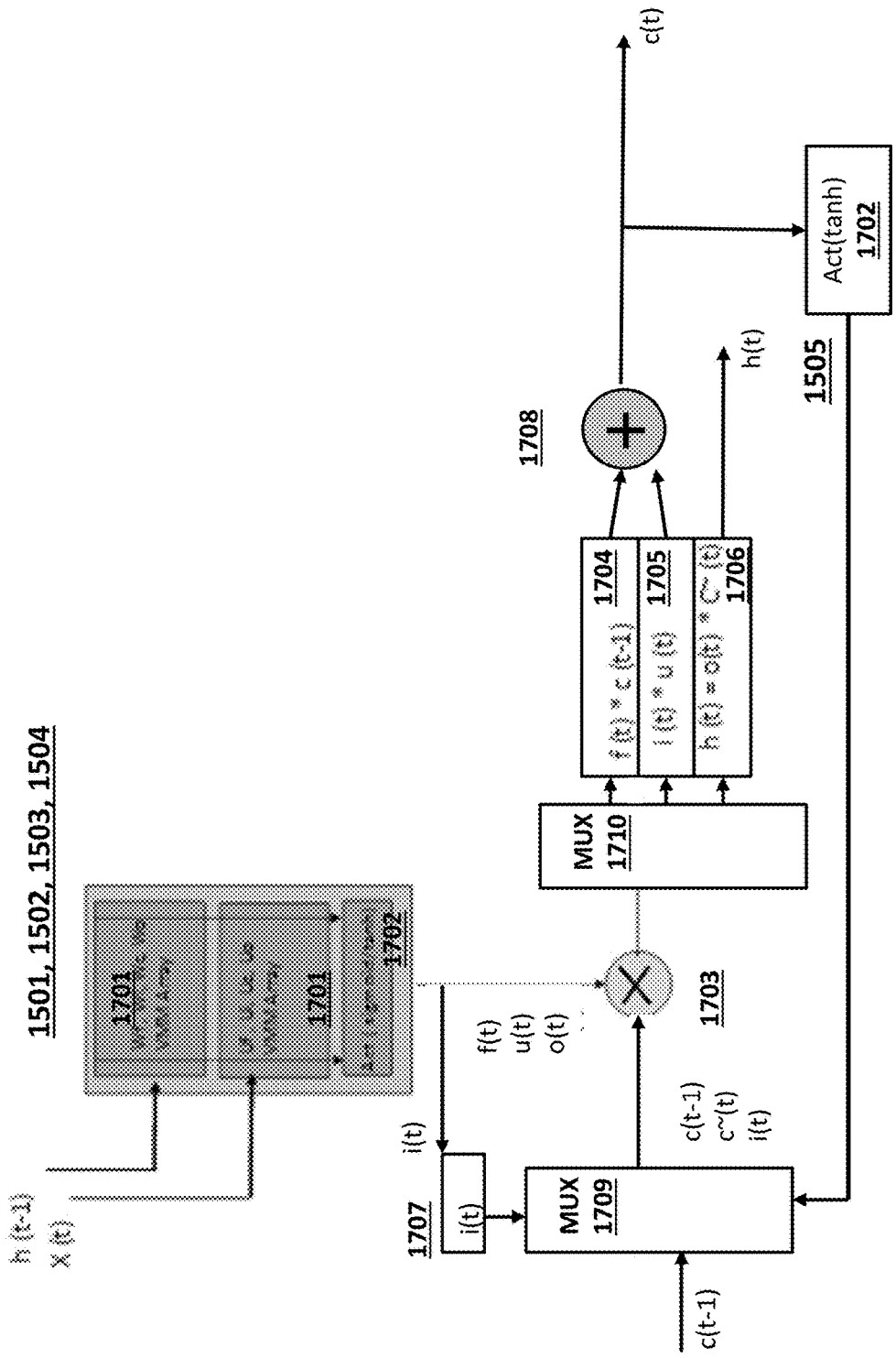
FIG. 17 depicts another embodiment of the exemplary cell of FIG. 15.

An alternative to LSTM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation circuit block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 18:
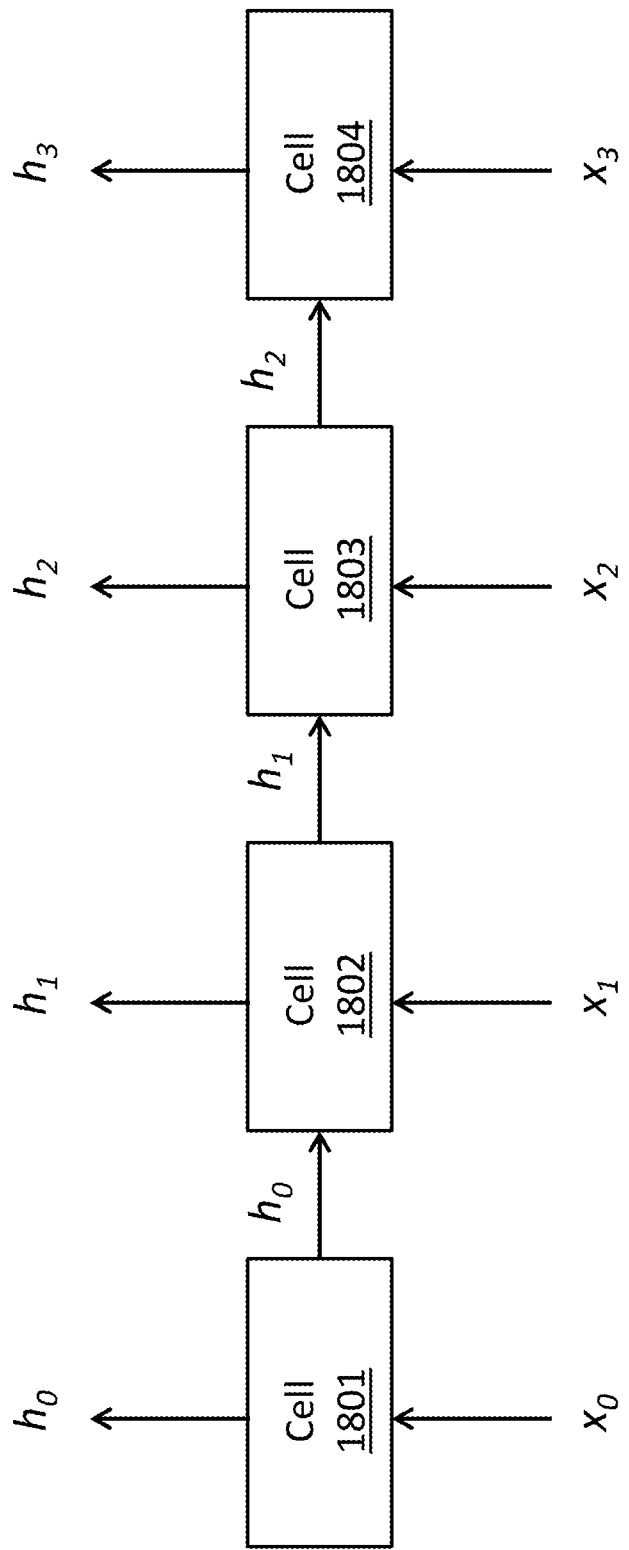
FIG. 18 depicts a prior art gated recurrent unit system.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

Figure 19:
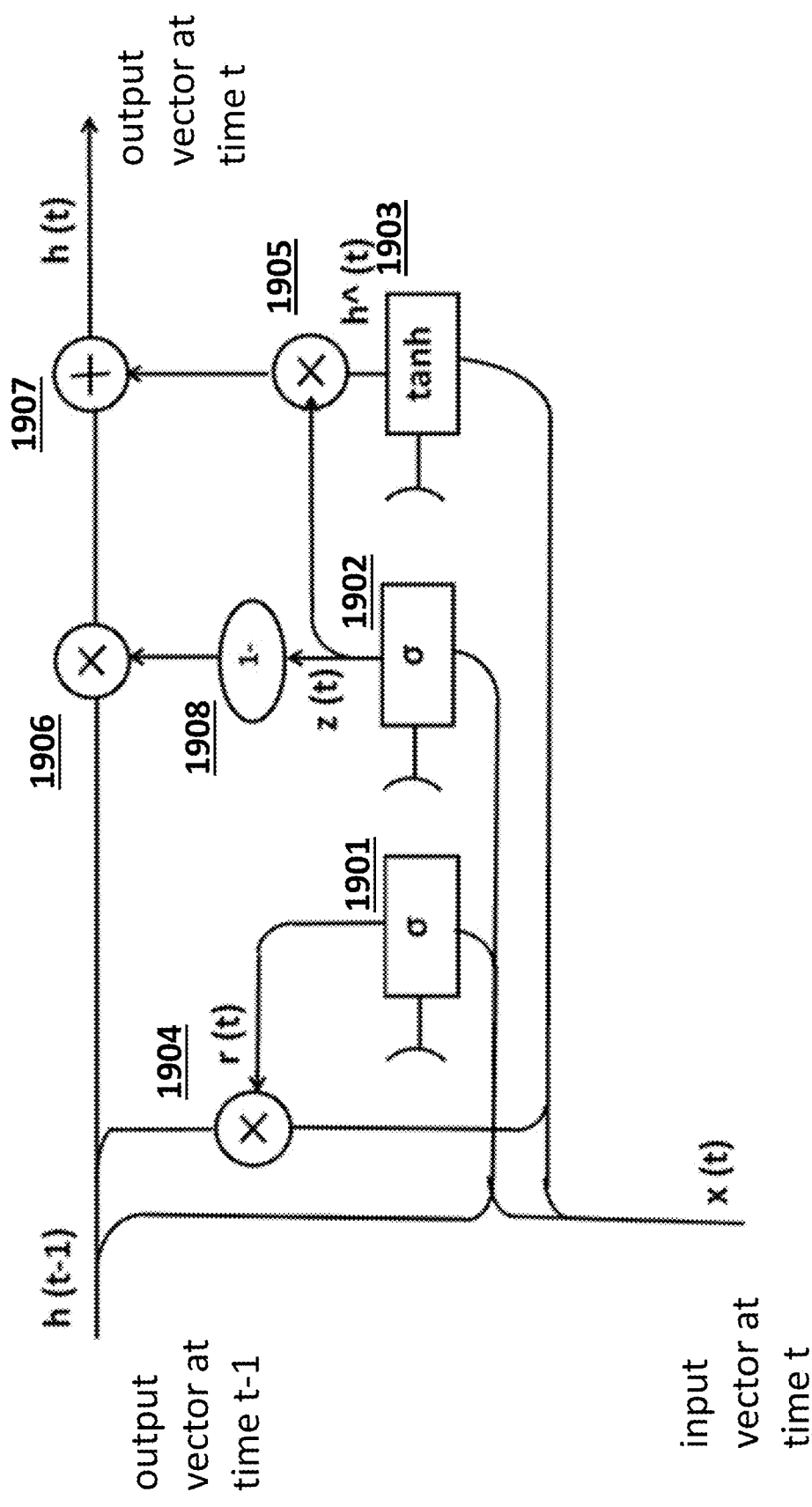
FIG. 19 depicts an exemplary cell for use in a gated recurrent unit system.

FIG. 19 depicts an exemplary implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

Figure 20:
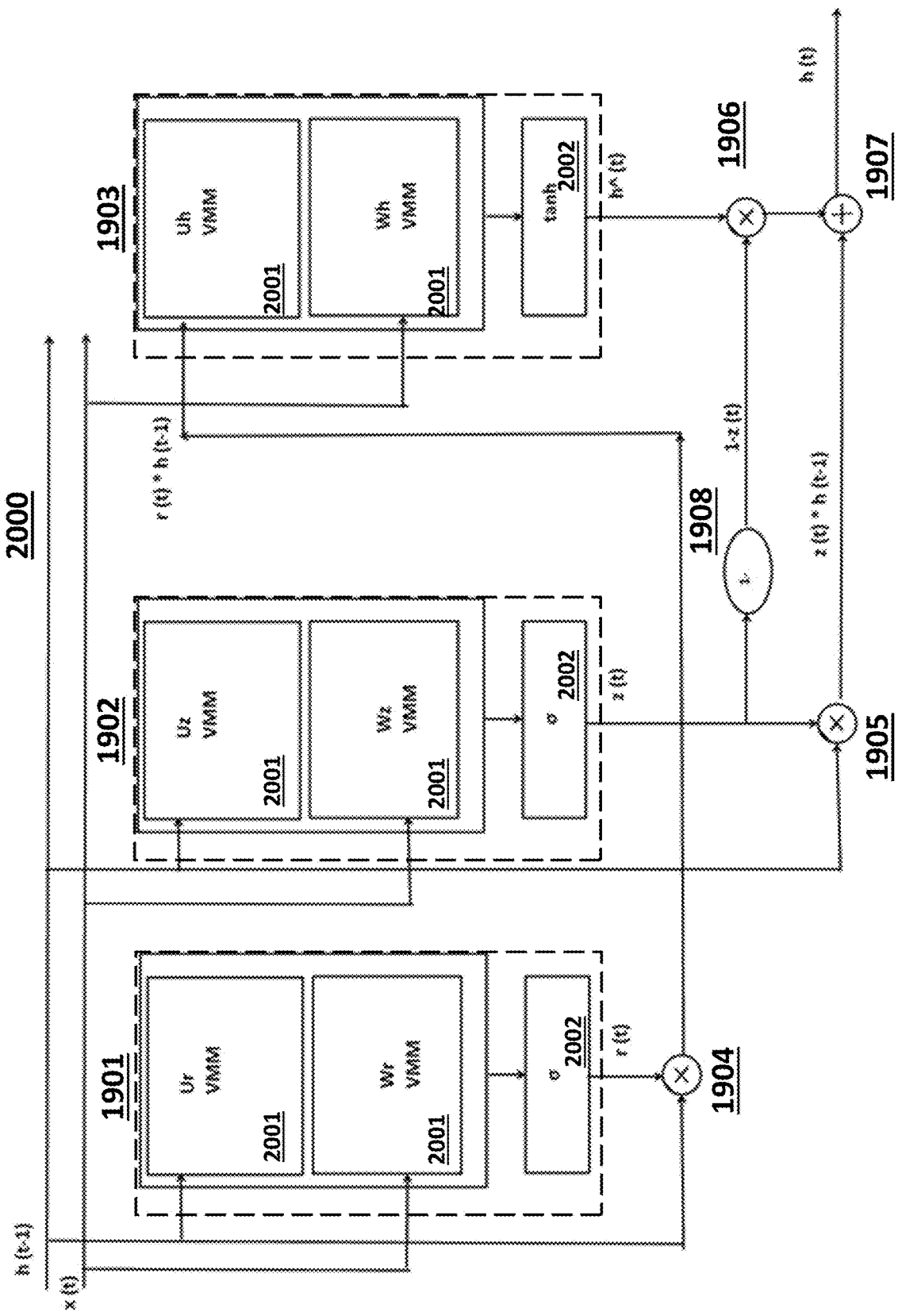
FIG. 20 depicts an embodiment of the exemplary cell of FIG. 19.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that VMM arrays are of particular use in GRU cells used in certain neural network systems.

Figure 21:
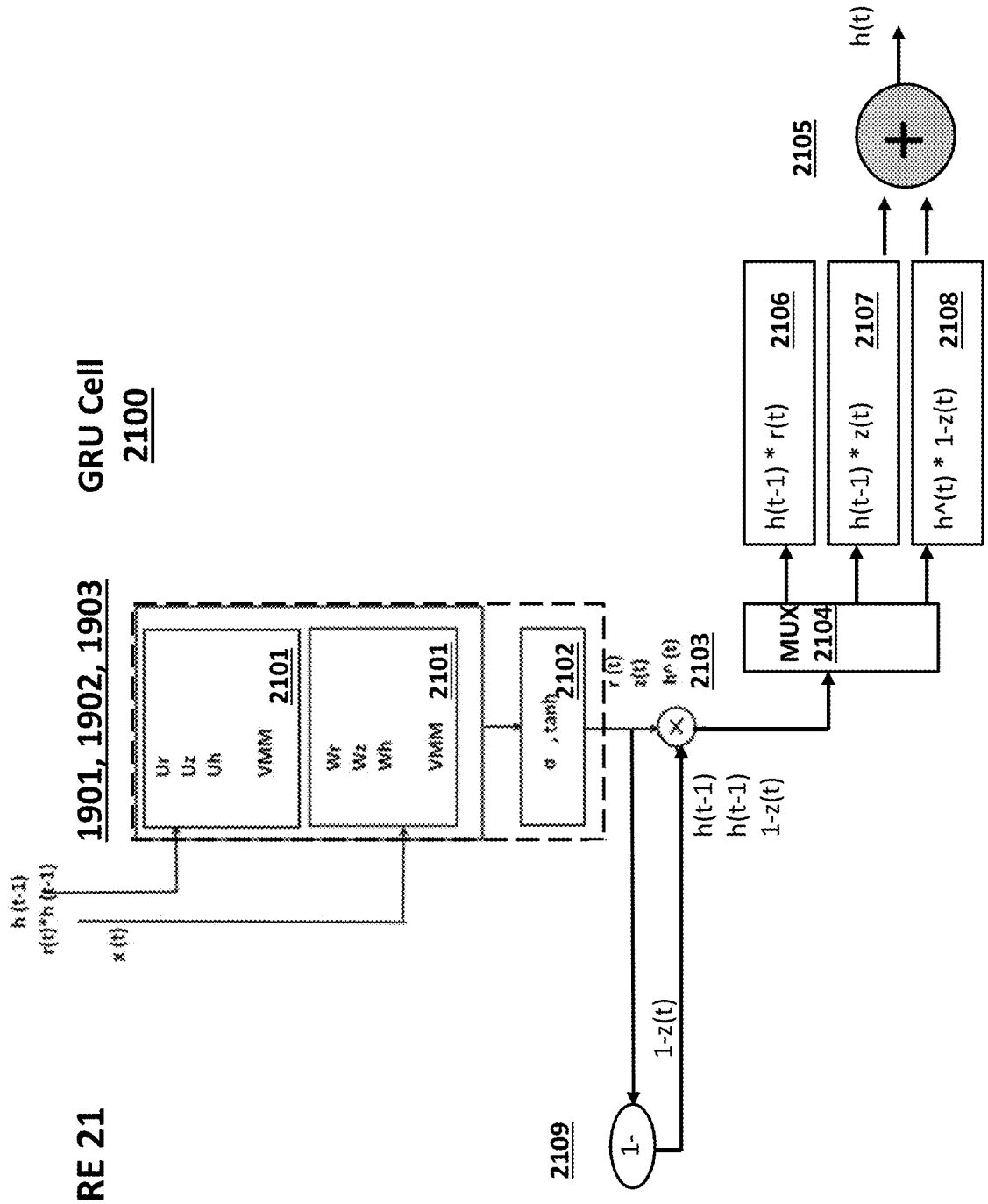
FIG. 21 depicts another embodiment of the exemplary cell of FIG. 19.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1) r(t) when that value is output from multiplier device 2103 through multiplexor 2104, register 2107 to hold the value h(t−1)*z(t) when that value is output from multiplier device 2103 through multiplexor 2104, and register 2108 to hold the value h^(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight w can be implemented by a single memory cell or by a differential cell or by two blend memory cells (average of 2 cells). In the differential cell case, two memory cells are needed to implement a weight w as a differential weight (w=w+−w−). In the two blend memory cells, two memory cells are needed to implement a weight w as an average of two cells.

Embodiments for Precise Programming of Cells in a VMM

Figure 22A:
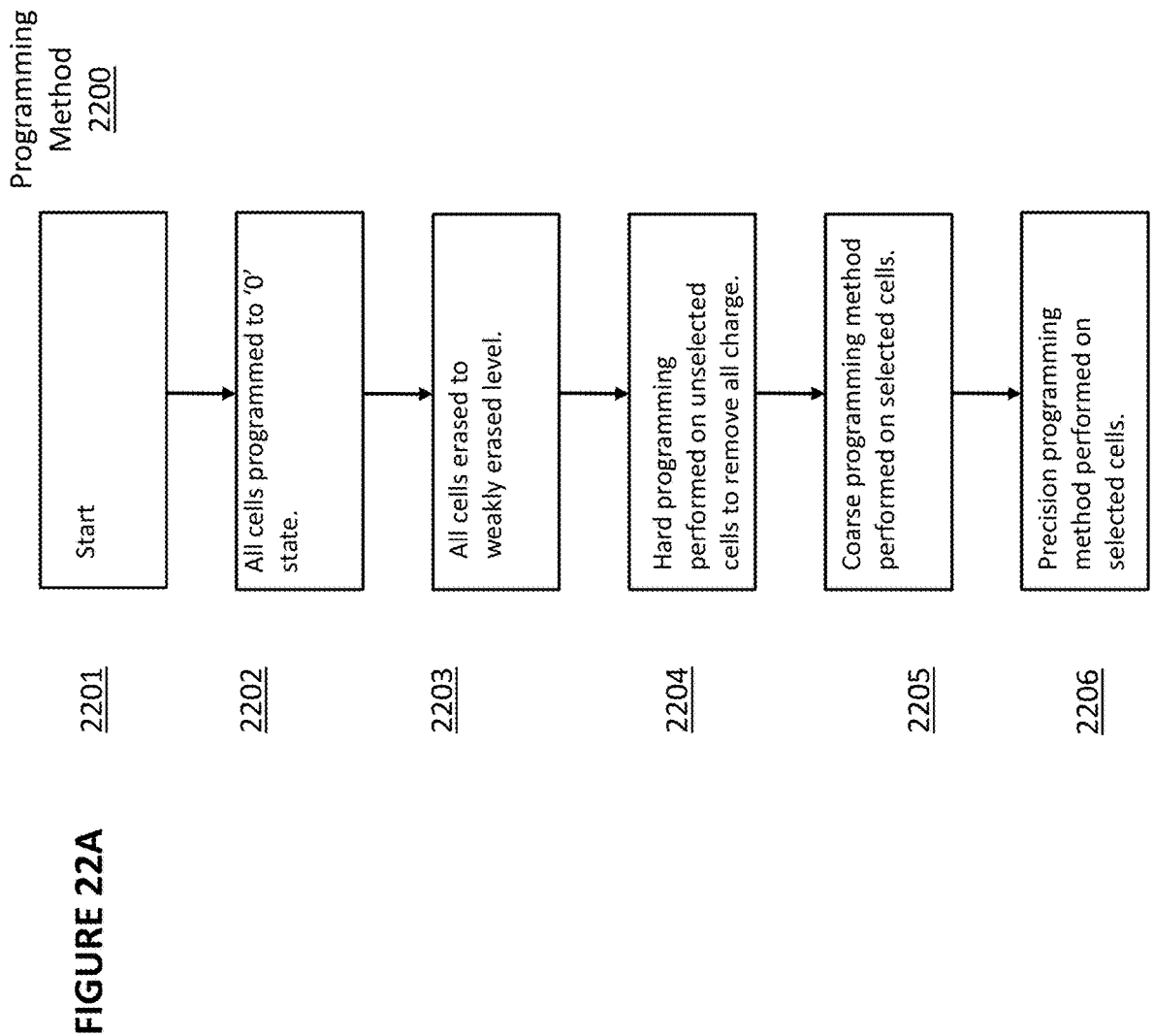
FIG. 22A depicts an embodiment of a method of programming a non-volatile memory cell.

FIG. 22A depicts programming method 2200. First, the method starts (step 2201), which typically occurs in response to a program command being received. Next, a mass program operation programs all cells to a '0' state (step 2202). Then a soft erase operation erases all cells to an intermediate weakly erased level such that each cell would draw current of approximately 3-5 µA during a read operation (step 2203). This is in contrast to a deeply erased level where each cell would draw current of approximately ~20-30 µA during a read operation. Then, a hard program is performed on all unselected cells to a very deep programmed state to add electrons to the floating gates of the cells (step 2204) to ensure that those cells are really "off," meaning that those cells will draw a negligible amount of current during a read operation.

A coarse programming method is then performed on the selected cells (step 2205), followed by a precision programming method on the selected cells (step 2206) to program the precise value desired for each selected cell.

Figure 22B:
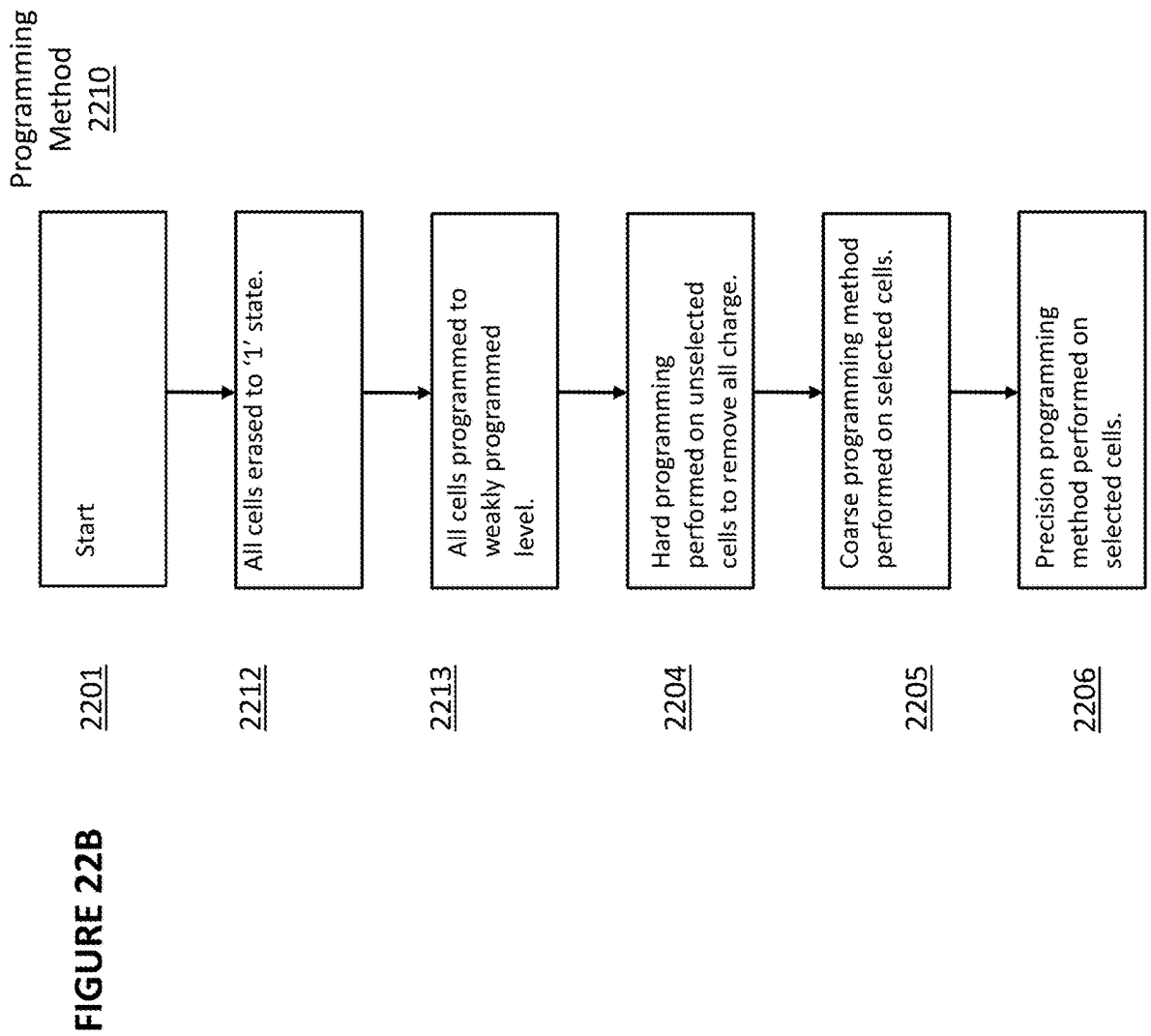
FIG. 22B depicts another embodiment of a method of programming a non-volatile memory cell.

FIG. 22B depicts another programming method 2210, which is similar to programming method 2200. However, instead of a program operation to program all cells to a '0' state as in step 2202 of FIG. 22A, after the method start (step 2201), an erase operation is used to erase all cells to a '1' state (step 2212). Then a soft program operation (step 2213) is used to program all cells to an intermediate state (level) such that each cell would draw current of approximately 3-5 uA during a read operation. Afterward, coarse and precision programming method would follow as in FIG. 22A. A variation of the embodiment of FIG. 22B would remove the soft programing method (step 2213) altogether.

Figure 23:
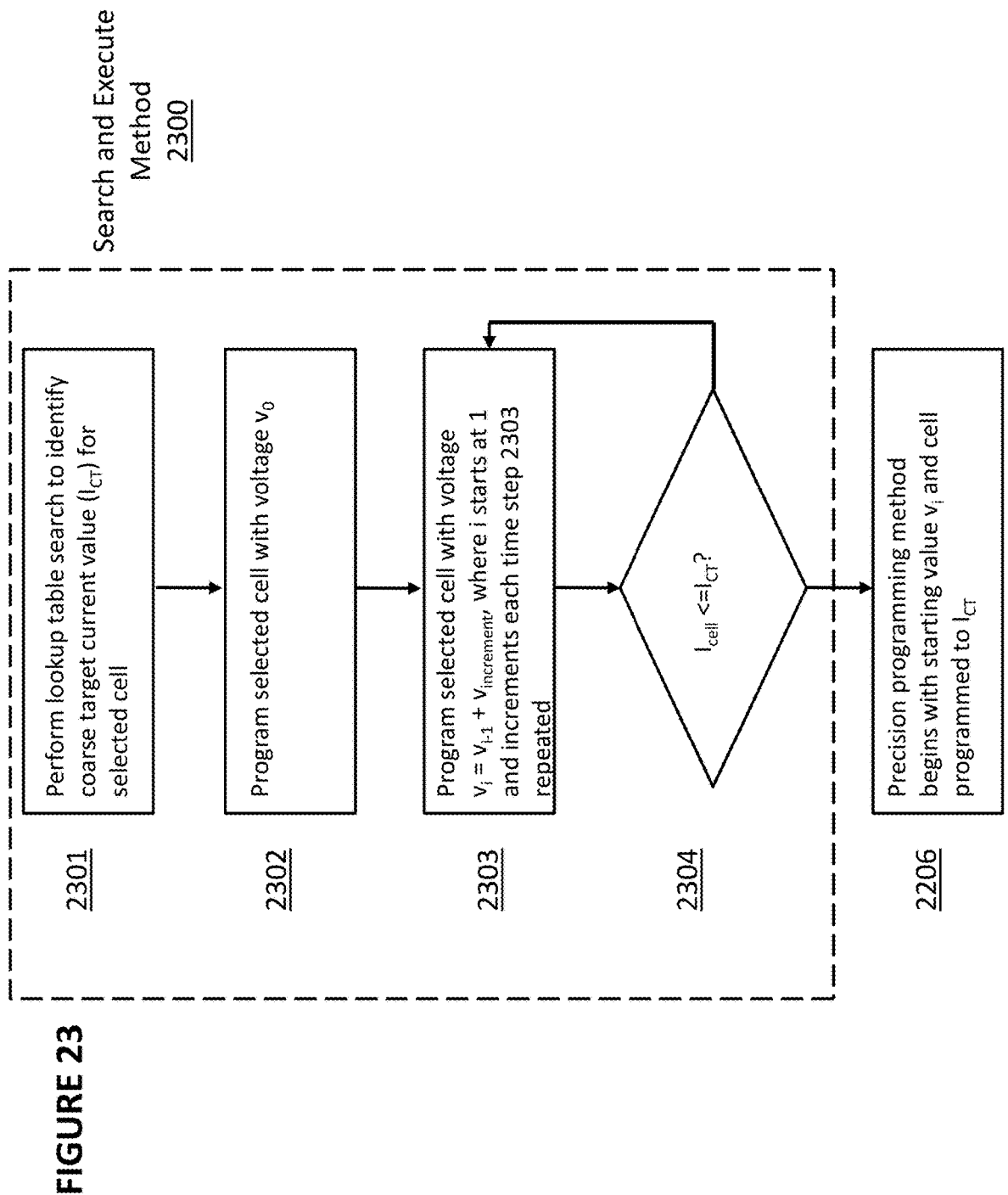
FIG. 23 depicts an embodiment of a coarse programming method.

FIG. 23 depicts a first embodiment of coarse programming method 2205, which is search and execute method 2300. First, a lookup table search is performed to determine a coarse target current value ($I_{CT}$) for the selected cell based on the value that is intended to be stored in that selected cell (step 2301). It is assumed that the selected cell can be programmed to store one of N possible values (e.g., 128, 64, 32, etc.). Each of the N values would correspond to a different desired current value ($I_D$) that is drawn by the selected cell during a read operation. In one embodiment, a look-up table might contain M possible current values to use as the coarse target current value $I_{CT}$ for the selected cell during search and execute method 2300, where M is an integer less than N. For example, if N is 8, then M might be 4, meaning that there are 8 possible values that the selected cell can store, and one of 4 coarse target current values will be selected as the coarse target for search and execute method 2300. That is, search and execute method 2300 (which again is an embodiment of coarse programming method 2205) is intended to quickly program the selected cell to a value ($I_{CT}$) that is somewhat close to the desired value ($I_D$), and then the precision programming method 2206 is intended to more precisely program the selected cell to be extremely close to the desired value ($I_D$).

Examples of cell values, desired current values, and coarse target current values are depicted in Tables 9 and 10 for the simple example of N=8 and M=4:

TABLE NO. 9

Example of N Desired Current Values for N = 8

| Value Stored in Selected Cell | Desired Current Value ($I_D$) |
|---|---|
| 000 | 100 pA |
| 001 | 200 pA |
| 010 | 300 pA |
| 011 | 400 pA |
| 100 | 500 pA |
| 101 | 600 pA |
| 110 | 700 pA |
| 111 | 800 pA |

TABLE NO. 10

Example of M Target Current Values for M = 4

| Coarse Target Current Value ($I_{CT}$) | Associated Cell Values |
|---|---|
| 200 pA + $I_{CTOFFSET1}$ | 000, 001 |
| 400 pA + $I_{CTOFFSET2}$ | 010, 011 |
| 600 pA + $I_{CTOFFSET3}$ | 100, 101 |
| 800 pA + $I_{CTOFFSET4}$ | 110, 111 |

The offset values $I_{CTOFFSETx}$ are used to prevent overshooting the desired current value during coarse tuning.

Once the coarse target current value $I_{CT}$ is selected, the selected cell is programmed by applying the voltage $v_0$ to the appropriate terminal of selected cell based on the cell architecture type of the selected cell (e.g., memory cells 210, 310, 410, or 510) (step 2302). If the selected cell is of type memory cell 310 in FIG. 3, then the voltage $v_0$ will be applied to control gate terminal 28, and $v_0$ might be 5-7V depending on coarse target current value $I_{CT}$. The value of $v_0$ optionally can be determined from a voltage look up table that stores $v_0$ vs. coarse target current value $I_{CT}$.

Next, the selected cell is programmed by applying the voltage $v_i = v_{i-1} + v_{increment}$, where i starts at 1 and increments each time this step is repeated, and where $v_{increment}$ is a small voltage that will cause a degree of programming that is appropriate for the granularity of change desired (step 2303). Thus, the first time step 2303 is performed, i=1, and $v_1$ will be $v_0 + v_{increment}$. Then a verify operation occurs (step 2304), wherein a read operation is performed on the selected cell and the current drawn through the selected cell ($I_{cell}$) is measured. If $I_{cell}$ is less than or equal to $I_{CT}$ (which here is a first threshold value), then search and execute method 2300 is complete and precision programming method 2206 can begin. If $I_{cell}$ is not less than or equal to $I_{CT}$, then step 2303 is repeated, and i is incremented.

Thus, at the point when coarse programming method 2205 ends and precision programming method 2206 begins, the voltage $v_i$ will be the last voltage used to program the selected cell, and the selected cell will be storing a value associated with the coarse target current value $I_{CT}$. The goal of precision programming method 2206 is to program the selected cell to the point where during a read operation it draws a current $I_D$ (plus or minus an acceptable amount of deviation, such as 50 pA or less), which is the desired current value that is associated with the value that is intended to be stored in the selected cell.

Figure 24:
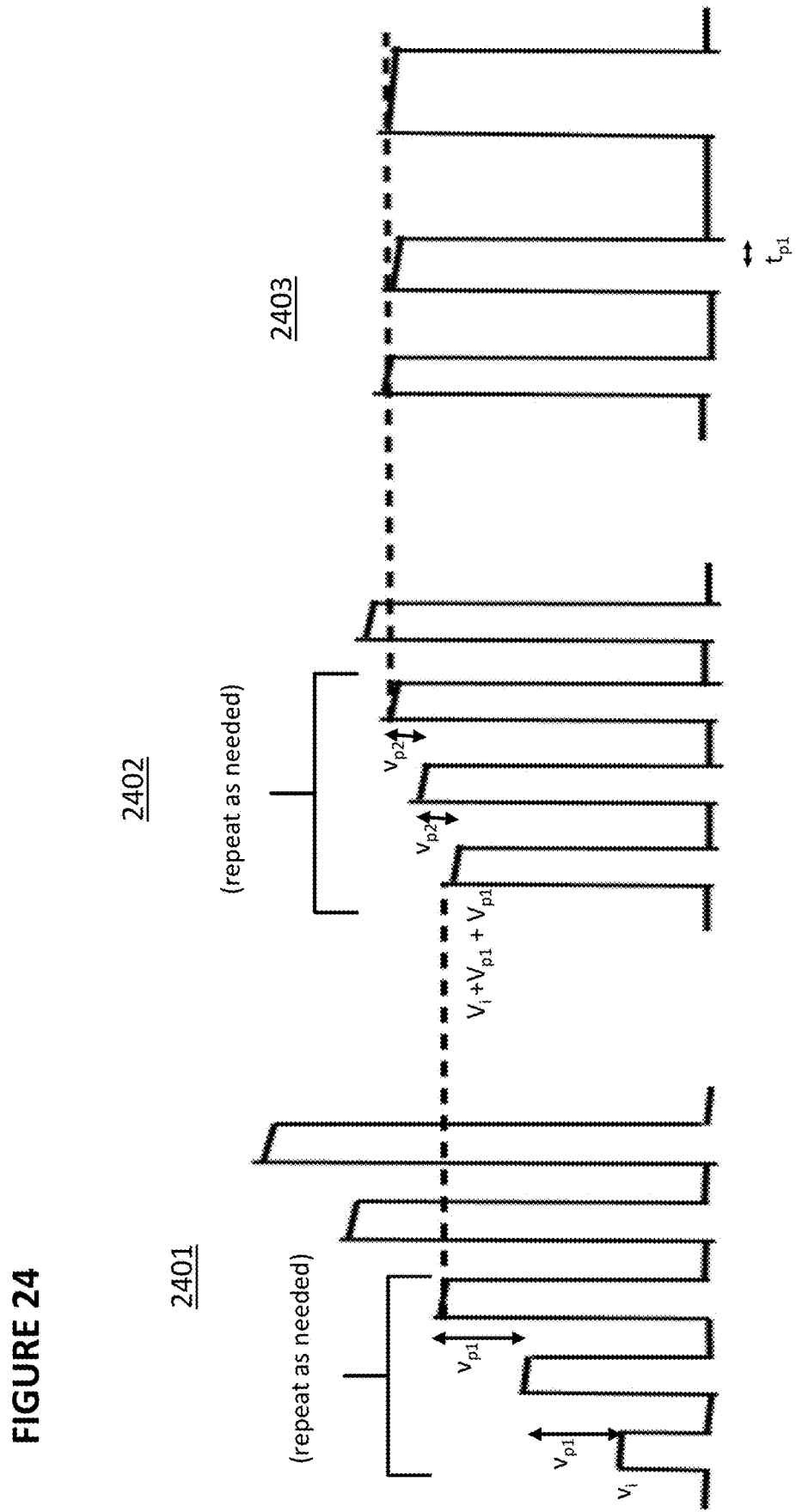
FIG. 24 depicts exemplary pulses used in the programming of a non-volatile memory cell.

FIG. 24 depicts examples of different voltage progressions that can be applied to the control gate of a selected memory cell during precision program method 2206.

Under a first approach, increasing voltages are applied in progression to the control gate to further program the selected memory cell. The starting point is $v_i$, which is the last voltage applied during coarse programming method 2205. An increment of $v_{p1}$ is added to $v_1$ and the voltage $v_1+v_{p1}$ is then used to program the selected cell (indicated by the second pulse from the left in progression 2401). $v_{p1}$ is an increment that is smaller than $v_{increment}$ (the voltage increment used during coarse programming method 2205). After each programming voltage is applied, a verify step (similar to step 2304) is performed, where a determination is made if Icell is less than or equal to $I_{PT1}$ (which is the first precision target current value and here is a second threshold value), where $I_{PT1}=I_D+I_{PT1OFFSET}$, where $I_{PT1OFFSET}$ is an offset valued added to prevent program overshoot. If it is not, then another increment $v_{p1}$ is added to the previously-applied programming voltage, and the process is repeated. At the point where $I_{cell}$ is less than or equal to $I_{PT1}$, then this portion of the programming sequence stops. Optionally, if $I_{PT1}$ is equal to $I_D$, or almost equal to $I_D$ with sufficient precision, then the selected memory cell has been successfully programmed.

Figure 25:
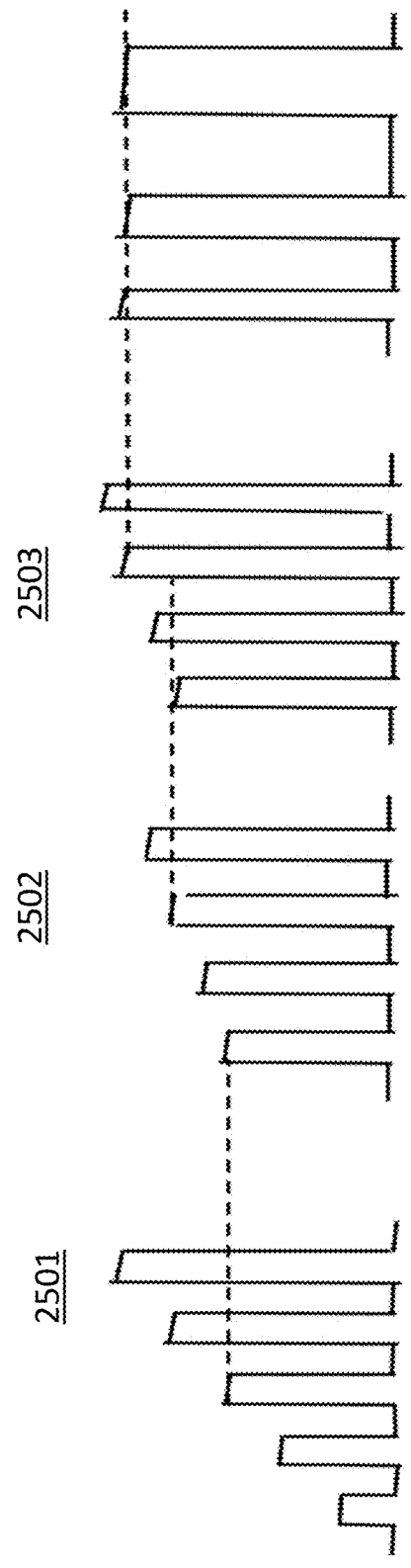
FIG. 25 depicts exemplary pulses used in the programming of a non-volatile memory cell.

If $I_{PT1}$ is not close enough to $I_D$, then further programming of a smaller granularity can occur. Here, progression 2402 is now used. The starting point for progression 2402 is the last voltage used for programming under progression 2401. A increment of $V_{p2}$ (which is smaller than $v_{p1}$) is added to that voltage, and the combined voltage is applied to program the selected memory cell. After each programming voltage is applied, a verify step (similar to step 2304) is performed, where a determination is made if $I_{cell}$ is less than or equal to $I_{PT2}$ (which is the second precision target current value and here is a third threshold value), where $I_{PT2}=I_D+I_{PT2OFFSET}$, $I_{PT2OFFSET}$ is an offset value added to prevent program overshoot. If it is not, then another increment $V_{p2}$ is added to the previously-applied programming voltage, and the process is repeated. At the point where $I_{cell}$ is less than or equal to $I_{PT2}$, then this portion of the programming sequence stops. Here, it is assumed that $I_{PT2}$ is equal to $I_D$ or close enough to $I_D$ that the programming can stop, since the target value has been achieved with sufficient precision. One of ordinary skill in the art can appreciate that additional progressions can be applied with smaller and smaller programming increments used. For example, in FIG. 25, three progressions (2501, 2502, and 2503) are applied instead of just two.

A second approach is shown in progression 2403. Here, instead of increasing the voltage applied during the programming of the selected memory cell, the same voltage is applied for durations of increasing period. Instead of adding an incremental voltage such as $v_{p1}$ in progression 2401 and $v_{p2}$ in progression 2403, an additional increment of time $t_{p1}$ is added to the programming pulse such that each applied pulse is longer than the previously-applied pulse by $t_{p1}$. After each programming pulse is applied, the same verify step is performed as described previously for progression 2401. Optionally, additional progressions can be applied where the additional increment of time added to the programming pulse is of a smaller duration than the previous progression used. Although only one temporal progression is shown, one of ordinary skill in the art will appreciate that any number of different temporal progressions can be applied.

Additional detail will now be provided for two additional embodiments of coarse programming method 2205.

Figure 26:
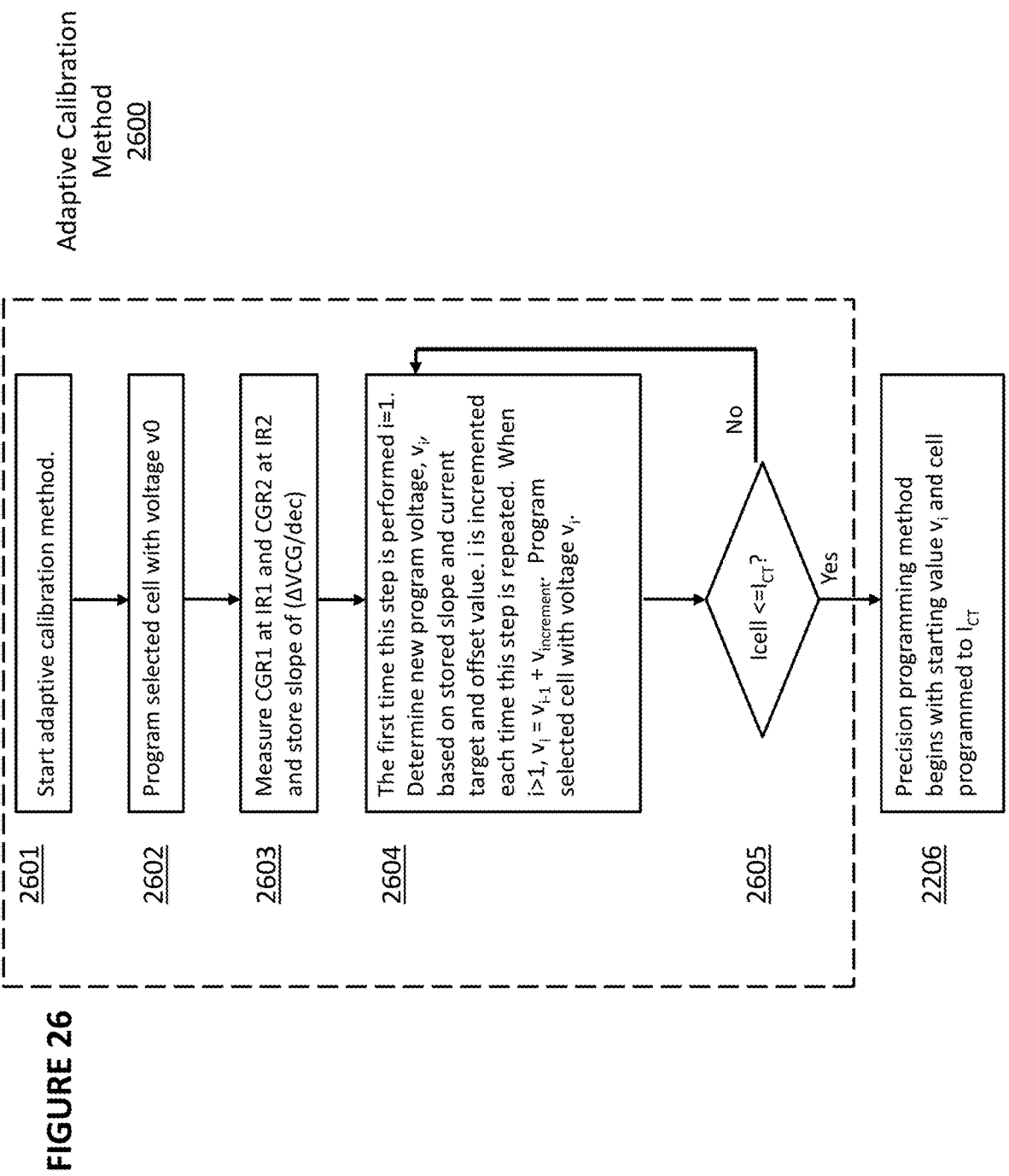
FIG. 26 depicts a calibration algorithm for the programming of a non-volatile memory cell that adjusts the programming parameters based on slope characteristics of the cell.

FIG. 26 depicts a second embodiment of coarse programming method 2205, which is adaptive calibration method 2600. The method starts (step 2601). The cell is programmed at a default start value $v_0$ (step 2602). Unlike in search and execute method 2300, here $v_0$ is not derived from a lookup table, and instead can be a relatively small initial value. The control gate voltage of the cell is measured at a first current value IR1 (e.g., 100 na) and a second current value IR2 (e.g., 10 na), and a sub-threshold slope is determined based on those measurements (e.g., 360 mV/dec) and stored (step 2603).

A new desired voltage, $v_i$, is determined. The first time this step is performed, i=1, and $v_1$ is determined based on the stored sub-threshold slope value and a current target and offset value using a sub-threshold equation, such as the following:

$$Vi=Vi-1+V\text{increment},$$

Vincrement is proportional to slope of Vg $$Vg=k*Vt*\log [Ids/wa*Io]$$

Here, wa is w of a memory cell, Ids is the current target plusoffset value.

If the stored slope value is relatively steep, then a relatively small current offset value can be used. If the stored slope value is relatively flat, then a relatively high current offset value can be used. Thus, determining the slope information will allow for a current offset value to be selected that is customized for the particular cell in question. This ultimately will make the programming process shorter. When this step is repeated, i is incremented, and $v_i=v_{i-1}+v_{increment}$. The cell is then programmed using vi. $v_{increment}$ can be determined from a lookup table storing values of $v_{increment}$ vs. target current value.

Next, a verify operation occurs, wherein a read operation is performed on the selected cell and the current drawn through the selected cell ($I_{cell}$) is measured (step 2605). If $I_{cell}$ is less than or equal to $I_{CT}$ (which here is a coarse target threshold value), where $I_{CT}$ is set=$I_D+I_{CTOFFSET}$, where $I_{CTOFFSET}$ is an offset value added to prevent program overshoot, then adaptive calibration method 2600 is complete and precision programming method 2206 can begin. If $I_{cell}$ is not less than or equal to $I_{CT}$, then steps 2604-2605 are repeated, and i is incremented.

Figure 27:
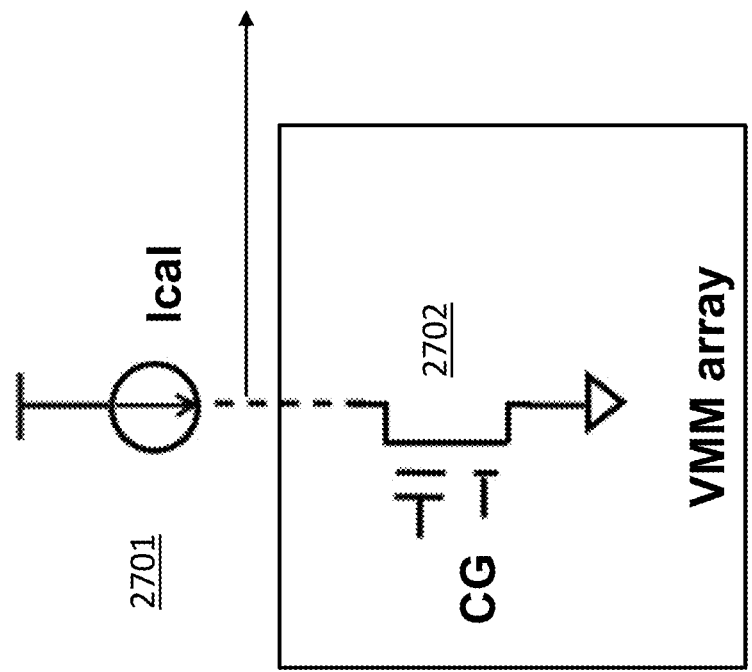
FIG. 27 depicts a circuit used in the calibration algorithm of FIG. 26.

FIG. 27 depicts aspects of adaptive calibration method 2600. During step 2603, current source 2701 is used to apply the exemplary current values IR1 and IR2 to the selected cell (here, memory cell 2702), and the voltage (CGR1 for IR1 and CGR2 for IR2) at the control gate of memory cell 2702 is then measured. The slope will be (CGR2−CGR1)/dec.

Figure 28:
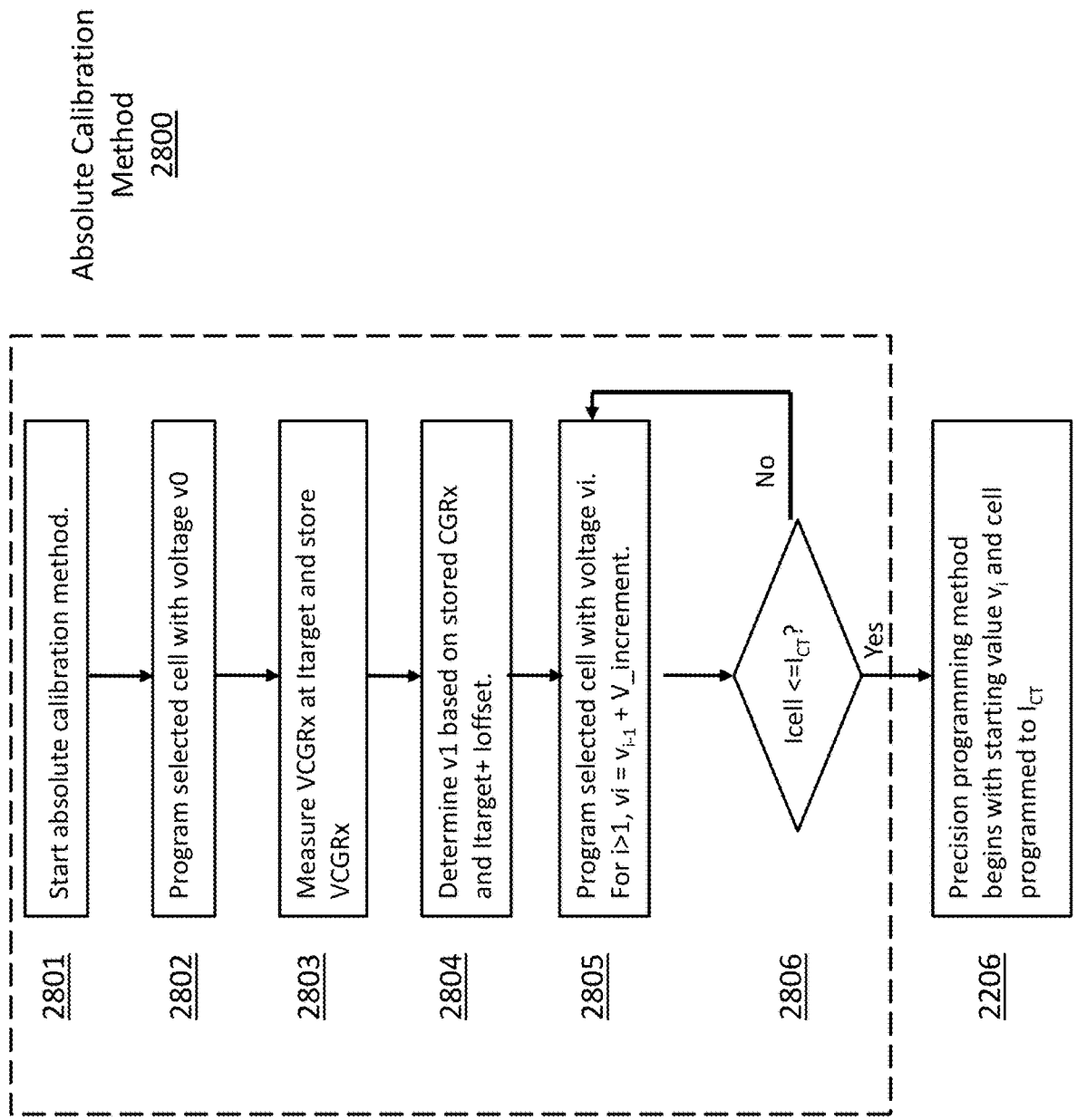
FIG. 28 depicts a calibration algorithm for the programming of a non-volatile memory cell.

FIG. 28 depicts a second embodiment of coarse programming method 2205, which is absolute calibration method 2800. The method starts (step 2801). The cell is programmed at a default starting value $V_0$ (step 2802). The control gate voltage of the cell (VCGRx) is measured at a current value Itarget and stored (step 2803). A new desired voltage, $v_1$, is determined based on the stored control gate voltage and a current target and offset value, Ioffset+Itarget (step 2804). For example, the new desired voltage, $v_1$, can be calculated as follows: $v_1=v_0+(\text{VCGBIAS}-\text{stored VCGR})$, where VCGBIAS=~1.5V, which is the default read control gate voltage at a maximum target current and stored VCGR is the measured read control gate voltage of step 2803.

The cell is then programmed using $v_i$. When i=1, the voltage $v_1$ from step 2804 is used. When i>=2, the voltage $v_i=v_{i-1}+V_{increment}$ is used. $v_{increment}$ can be determined from a lookup table storing values of $v_{increment}$ vs. target current value. Next, a verify operation occurs, wherein a read operation is performed on the selected cell and the current drawn through the selected cell ($I_{cell}$) is measured (step 2806). If $I_{cell}$ is less than or equal to $I_{CT}$ (which here is a threshold value), then absolute calibration method 2800 is complete and precision programming method 2206 can begin. If $I_{cell}$ is not less than or equal to $I_{CT}$, then steps 2805-2806 are repeated, and i is incremented.

Figure 29:
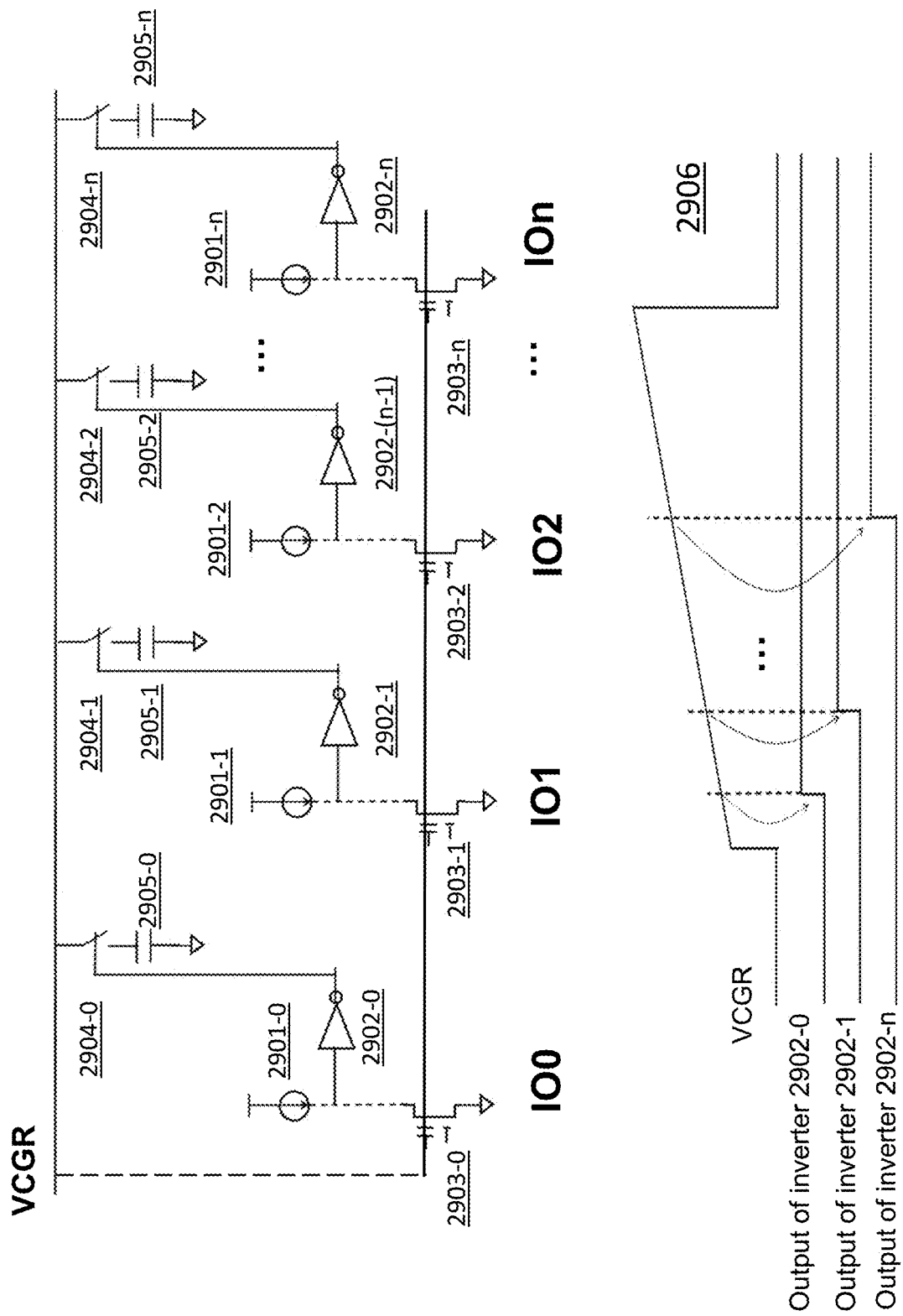
FIG. 29 depicts a circuit used in the calibration algorithm of FIG. 28.

FIG. 29 depicts circuit 2900 for implementing step 2803 of absolute calibration method 2800. A voltage source (not shown) generates VCGR, which begins at an initial voltage and ramps upward. Here, n+1 different current sources 2901 (2901-0, 2901-1, 2901-2, . . . , 2901-n) generate different currents IO0, IO1, IO2, . . . IOn of increasing magnitude. Each current source 2901 is connected to inverter 2902 (2902-0, 2902-1, 2902-2, . . . , 2902-n) and memory cell 2903 (2903-0, 2903-1, 2903-2, . . . 2903-n). As VCGR ramps upward, each memory cell 2903 draws increasing amounts of current, and the input voltage to each inverter 2902 decreases. Because IO0<IO1<IO2< . . . <IOn, the output of inverter 2902-0 will switch from low to high first as VCGR increases. The output of inverter 2902-1 will switch from low to high next, then the output of inverter 2902-2, and so on, until the output of inverter 2902-n switches from low to high. Each inverter 2902 controls switch 2904 (2904-0, 2904-1, 2904-2, . . . , 2904-n), such that when the output of inverter 2902 is high, switch 2904 is closed, which will cause VCGR to be sampled by capacitor 2905 (2905-0, 2905-1, 2905-2, . . . , 2905-n). Thus, switch 2904 and capacitor 2905 form a sample-and-hold circuit. The values of IO0, IO1, IO2, . . . , IOn are used as possible values of Itarget and the respective sampled voltage is used as the associated value VCGRx in absolute calibration method 2800 of FIG. 28. Graph 2906 shows VCGR ramping upward over time, and the outputs of inverters 2902-0, 2902-1, and 2902-n switching from low to high at various times.

Figure 30:
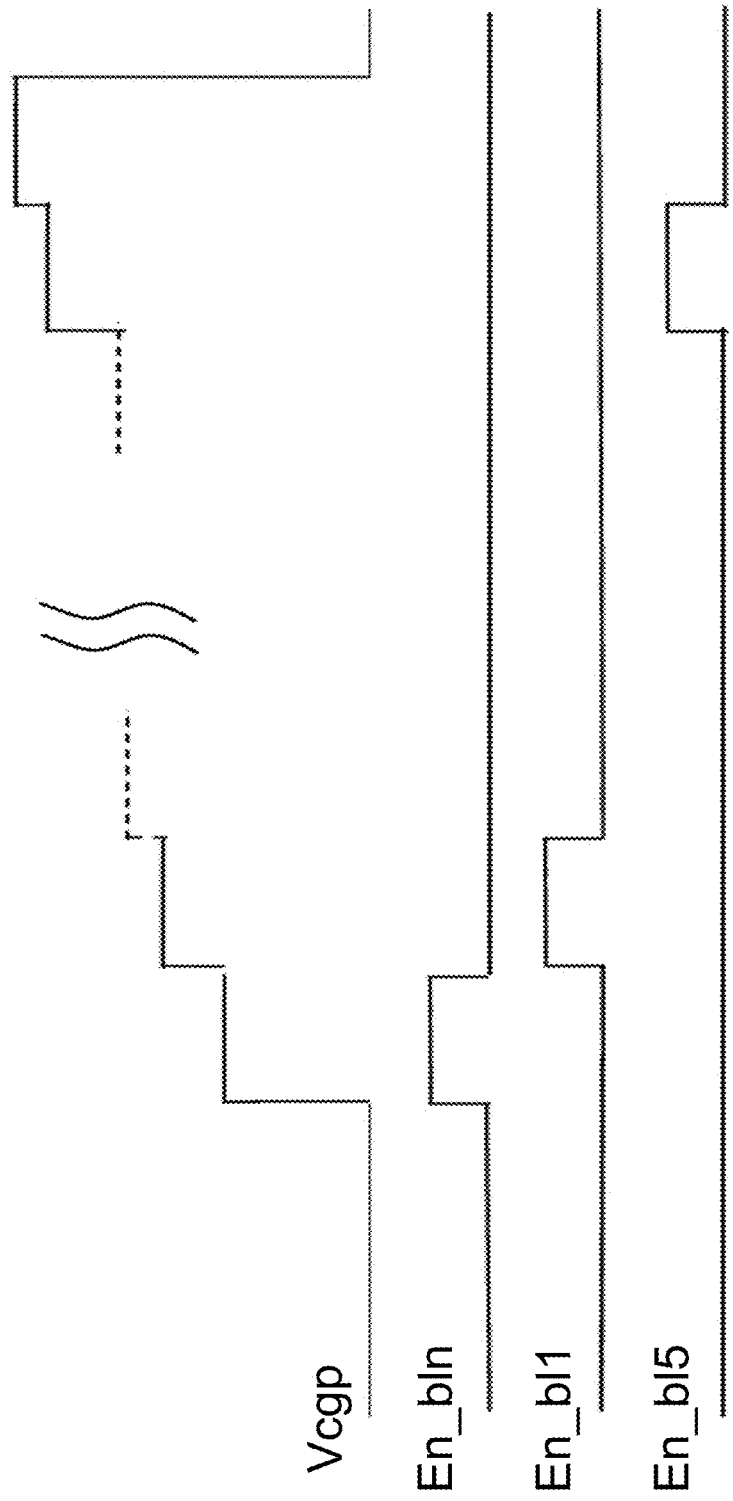
FIG. 30 depicts an exemplary progression of voltages applied to the control gate of a non-volatile memory cell during a programming operation.

FIG. 30 depicts exemplary progression 3000 for programming a selected cell during adaptive calibration method 2600 or absolute calibration method 2800. In one embodiment, the voltage Vcgp is applied to the control gates of a selected row of memory cells. The number of selected memory cells in the selected row is for example=32 cells. Hence, up to 32 memory cells in a selected row can be programmed in parallel. Each memory cell is enabled to couple to a programming current Iprog by a bitline enable signal. If the bitline enable signal is inactive (meaning a positive voltage being applied to selected bitline), the memory cell is inhibited (not being programmed). As shown in FIG. 30, bitline enabling signal En_blx (where x varies between 1 and n, where n is the number of bit lines) is enabled at different time with a Vcgp voltage level desired for that bitline (hence for selected memory on said bitline). In another embodiment, the voltage applied to the control gate of the selected cell can be controlled using enable signals on the bitline. Each bitline enable signal causes a desired voltage (such as vi described in FIG. 28) corresponding to that bitline to be applied as Vcgp. The bitline enable signal may also control the programming current flowing into the bitline. In this example, each subsequent control gate voltage Vcgp is higher than the previous voltage. Alternatively, each subsequent control gate voltage can be lower or higher than the previous voltage. Each subsequent increment in Vcgp can either be equal or not equal to the previous increment.

Figure 31:
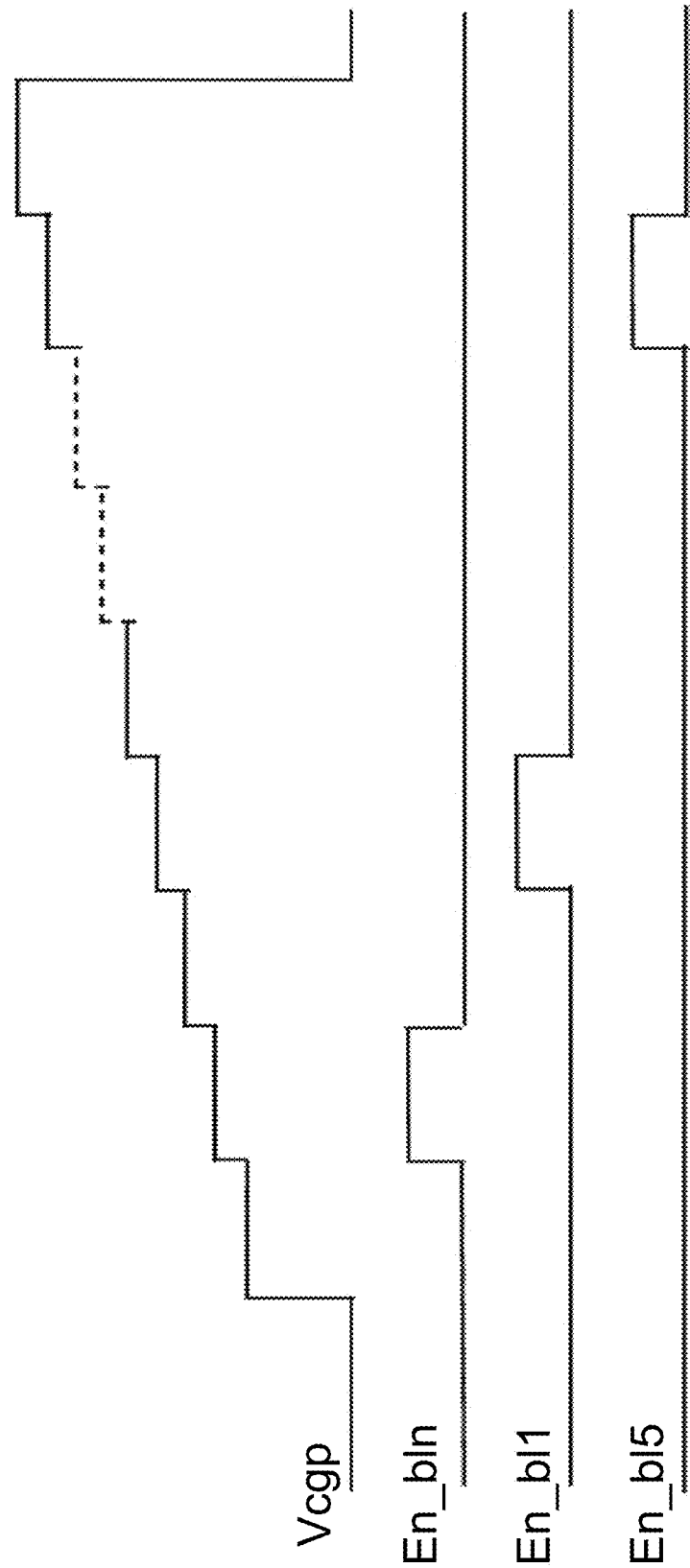
FIG. 31 depicts an exemplary progression of voltages applied to the control gate of a non-volatile memory cell during a programming operation.

FIG. 31 depicts exemplary progression 3100 for programming a selected cell during adaptive calibration method 2600 or absolute calibration method 2800. In one embodiment, bitline enable signal enables the selected bitline (meaning selected memory cell in said bitline) to be programmed with corresponding Vcgp voltage level. In another embodiment, the voltage applied to the increment ramping control gate of the selected cell can be controlled using bitline enable signals. Each bitline enable signal causes a desired voltage (such as vi described in FIG. 28) corresponding to that bitline to be applied to the control gate voltage. In this example, each subsequent increment is equal to the previous increment.

Figure 32:
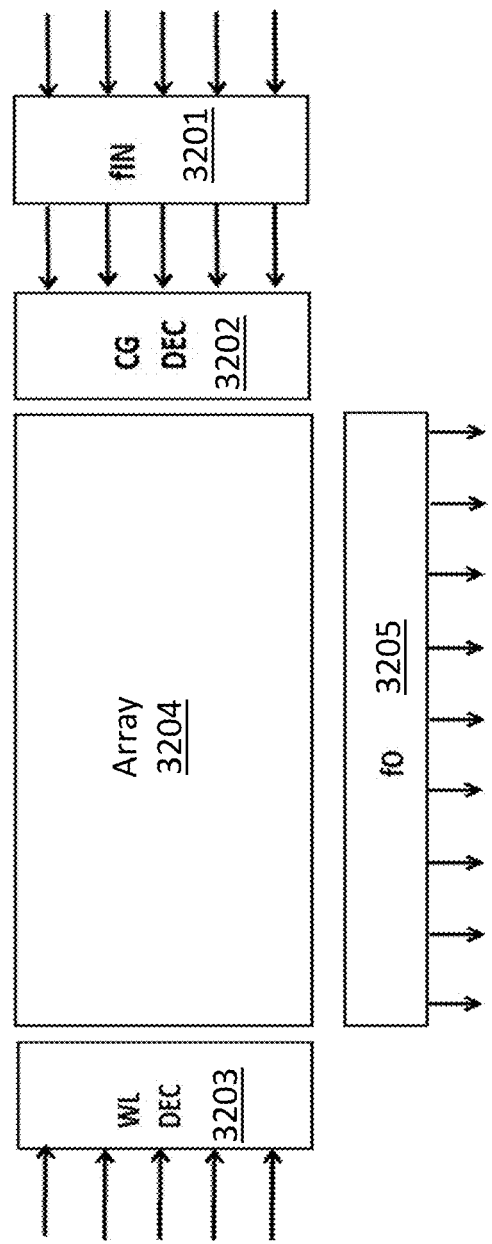
FIG. 32 depicts a system for applying programming voltages during the programming of a non-volatile memory cell within a vector-by-multiplication matrix system.

FIG. 32 depicts a system for implementing the input and output method for reading or verifying with a VMM array. The input function circuit 3201 receives digital bit values and converts those digital values into an analog signal that is then used to apply a voltage to the control gate of a selected cell in array 3204, which is determined through control gate decoder 3202. Meanwhile, word line decoder 3203 also is used to select the row in which the selected cell is located. Output neuron circuit block 3205 performs an output action of each column (neuron) of cells in array 3204. The output circuit block 3205 can be implemented using an integrating analog-to-digital converter (ADC), a successive approximation (SAR) ADC, or a Sigma-Delta ADC.

In one embodiment, the digital values provided to input function circuit 3201 comprise four bits (DIN3, DIN2, DIN1, and DIN0) as an example, and the various bit values correspond to different numbers of input pulses applied to the control gate. A greater number of pulses will cause a greater output value (current) of the cell. An example of bit values and pulse values is shown in Table No. 11:

TABLE NO. 11

| Digital Bit Inputs v. Pulses Generated | | | | |
|---|---|---|---|---|
| DIN3 | DIN2 | DIN1 | DIN0 | Pulses Generated |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |

In the above example, there are a maximum of 16 pulses for 4 bit digital values for reading out the cell value. Each pulse is equal to one unit cell value (current). For example, if Icell unit=1 nA, then for DIN[3-0]=0001, Icell=1*1 nA=1 nA; and for DIN[3-0]=1111, Icell=15*1 nA=15 nA.

In another embodiment, the digital bit input uses digital bit position summation to read out the cell value as shown in Table 12. Here, only 4 pulses are needed to evaluate the 4 bit digital value. For example, a first pulse is used to evaluate DIN0, a second pulse is used to evaluate DIN1, a third pulse is used to evaluate DIN2, and a fourth pulse is used to evaluate DIN3. Then, the results from the four pulses are summed according to bit position. The digital bit summation equation realized is the following: Output=$2^0$*DIN0+$2^1$*DIN1+$2^2$*DIN2+$2^3$*DIN3)*Icell unit.

For example, if Icell unit=1 nA, then for DIN[3-0]=0001, Icell total=0+0+0+1*1 nA=1 nA; and for DIN[3-0]=1111, Icell total=8*1 nA+4*1 nA+2*1 nA+1*1 nA=15 nA.

TABLE NO. 12

Digital Bit Input Summation

| $2^3$*DIN3 | $2^2$*DIN2 | $2^1$*DIN1 | $2^0$*DIN0 | Total values |
|---|---|---|---|---|
| 0 | 0 | 0 | 0 | 0 |
| 0 | 0 | 0 | 1 | 1 |
| 0 | 0 | 2 | 0 | 2 |
| 0 | 0 | 2 | 1 | 3 |
| 0 | 4 | 0 | 0 | 4 |
| 0 | 4 | 0 | 1 | 5 |
| 0 | 4 | 2 | 0 | 6 |
| 0 | 4 | 2 | 1 | 7 |
| 8 | 0 | 0 | 0 | 8 |
| 8 | 0 | 0 | 1 | 9 |
| 8 | 0 | 2 | 0 | 10 |
| 8 | 0 | 2 | 1 | 11 |
| 8 | 4 | 0 | 0 | 12 |
| 8 | 4 | 0 | 1 | 13 |
| 8 | 4 | 2 | 0 | 14 |
| 8 | 4 | 2 | 1 | 15 |

Figure 33:
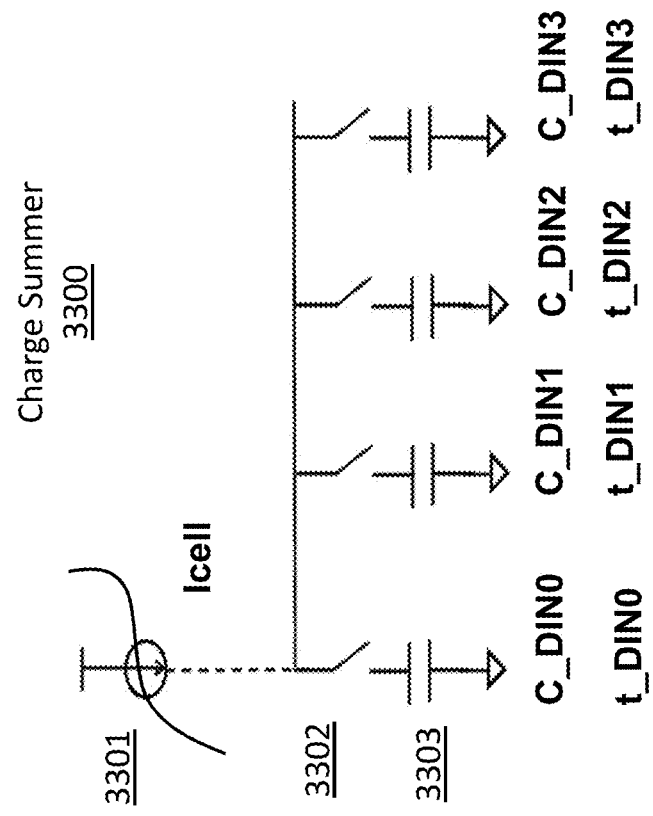
FIG. 33 depicts a charge summer circuit.

FIG. 33 depicts an example of charge summer 3300 that can be used to sum the output of a VMM during a verify operation to obtain a single analog value that represents the output, and that can optionally be then converted into digital bit values. Charge summer 3300 comprises current source 3301 and a sample-and-hold circuit comprising switch 3302 and sample-and-hold (S/H) capacitor 3303. As shown for an example of a 4-bit digital value, there are 4 S/H circuits to hold the value from 4 evaluation pulses, where the values are summed up at the end of the process. S/H capacitors 3303 are selected with ratios that are associated with the $2^n$*DINn bit position for that S/H capacitor; for example C_DIN3=x8 Cu, C_DIN2=x4 Cu, C_DIN1=x2 Cu, DIN0=x1 Cu. The current source 3301 is also ratioed accordingly.

Figure 34:
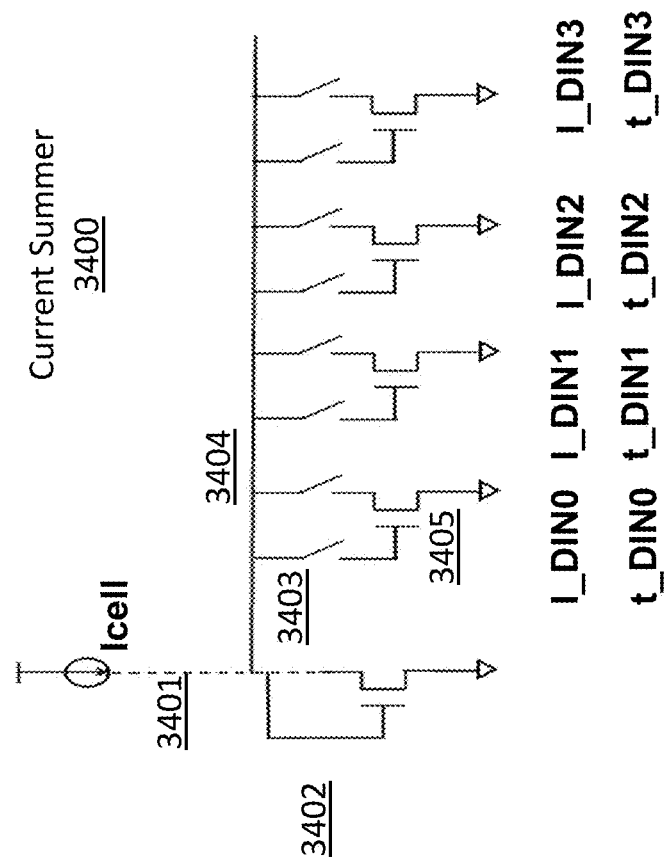
FIG. 34 depicts a current summer circuit.

FIG. 34 depicts current summer 3400 that can be used to sum the output of a VMM during a verify operation. Current summer 3400 comprises current source 3401, switch 3402, switches 3403 and 3404, and switch 3405. As shown for an example of a 4-bit digital value, there are current source circuits to hold the value from 4 evaluation pulses, where the values are summed up at the end of the process. The current source is ratioed based on the $2^n$*DINn bit position; for example, I_DIN3=x8 Icell unit, _I_DIN2=x4 Icell unit, I_DIN1=x2 Icell unit, I_DIN0=x1 Icell unit.

Figure 39:
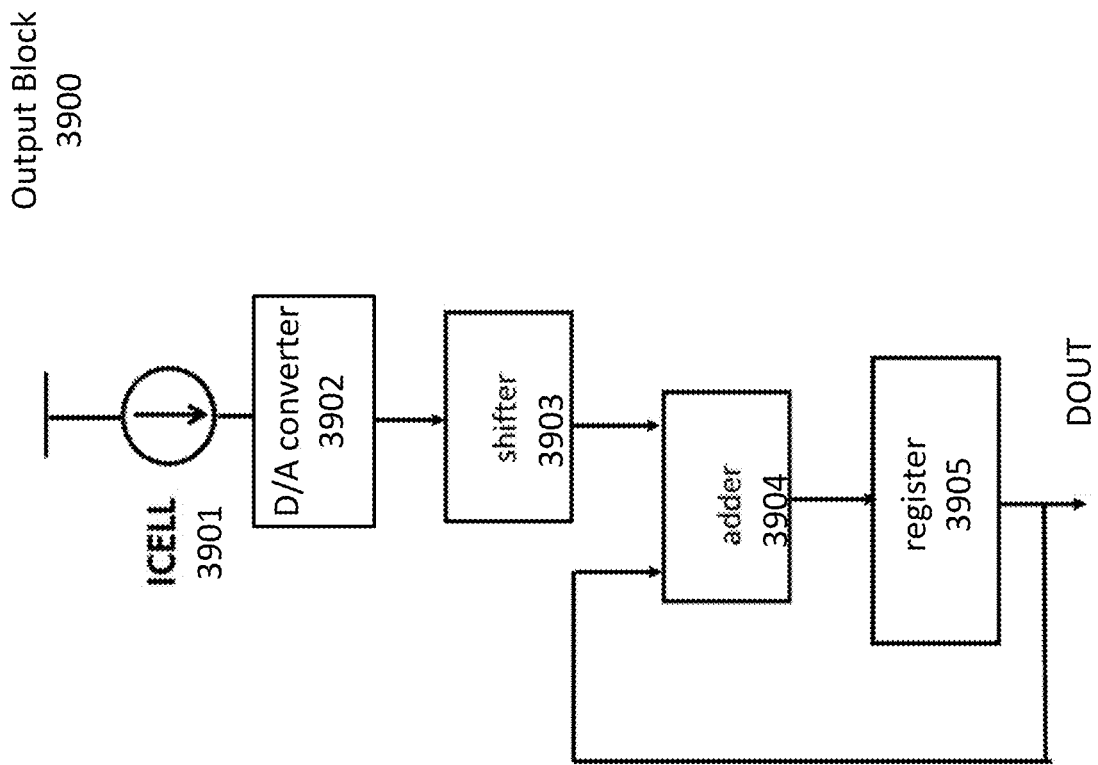
FIG. 39 depicts an output block.

FIG. 39 depicts output block 3900 (which is an embodiment of output block 3205 in FIG. 32). Output block 3900 receives an output current from a VMM (such as array 3204 in FIG. 32), here shown as ICELL 3901. Output block 3900 comprises D/A converter 3902, shifter 3903, adder 3904, and output register 3905.

Here, it is assumed that the input to the input block (such as input block 3201 in FIG. 32) of VMM is din_n, where n is a bit number and there are i bits total ranging from 0 to i−1. For example, if i=4, then the input will be four bits, din_3, din_2, din_1, and din_0. Each input bit, din_n, is applied to the input block 3201 of VMM 3204 one at a time.

Input block 3201 converts din_n into an input signal (using one of the embodiments described herein or other known techniques) that is applied to a terminal of the selected cell in array 3204. In one embodiment, the input signal is a pulse, as shown in Table 13 for an exemplary 4-bit input:

TABLE 13 exemplary table for 4-bit input with pulses

| DIN3 | DIN2 | DIN1 | DIN0 | TPULSE or PULSES |
|---|---|---|---|---|
| 0 | 0 | 0 | 0 | 0 |
| 0 | 0 | 0 | 1 | 1X |
| 0 | 0 | 1 | 0 | 2X |
| 0 | 0 | 1 | 1 | 3X |
| 0 | 1 | 0 | 0 | 4X |
| 0 | 1 | 0 | 1 | 5X |
| 0 | 1 | 1 | 0 | 6X |
| 0 | 1 | 1 | 1 | 7X |
| 1 | 0 | 0 | 0 | 8X |
| 1 | 0 | 0 | 1 | 9X |
| 1 | 0 | 1 | 0 | 10X |
| 1 | 0 | 1 | 1 | 11X |
| 1 | 1 | 0 | 0 | 12X |
| 1 | 1 | 0 | 1 | 13X |
| 1 | 1 | 1 | 0 | 14X |
| 1 | 1 | 1 | 1 | 15X |

In another embodiment, the input signal is an analog bias voltage, as shown in Table 14A for an exemplary 4-bit input:

TABLE 14A

Exemplary table for 4-bit input with analog bias level

| DIN3 | DIN2 | DIN1 | DIN0 | VCGIN |
|---|---|---|---|---|
| 0 | 0 | 0 | 0 | VCGIN0 |
| 0 | 0 | 0 | 1 | VCGIN1 |
| 0 | 0 | 1 | 0 | VCGIN2 |
| 0 | 0 | 1 | 1 | VCGIN3 |
| 0 | 1 | 0 | 0 | VCGIN4 |
| 0 | 1 | 0 | 1 | VCGIN5 |
| 0 | 1 | 1 | 0 | VCGIN6 |
| 0 | 1 | 1 | 1 | VCGIN7 |
| 1 | 0 | 0 | 0 | VCGIN8 |
| 1 | 0 | 0 | 1 | VCGIN9 |
| 1 | 0 | 1 | 0 | VCGIN10 |
| 1 | 0 | 1 | 1 | VCGIN11 |
| 1 | 1 | 0 | 0 | VCGIN12 |
| 1 | 1 | 0 | 1 | VCGIN13 |
| 1 | 1 | 1 | 0 | VCGIN14 |
| 1 | 1 | 1 | 1 | VCGIN15 |

Figure 35:
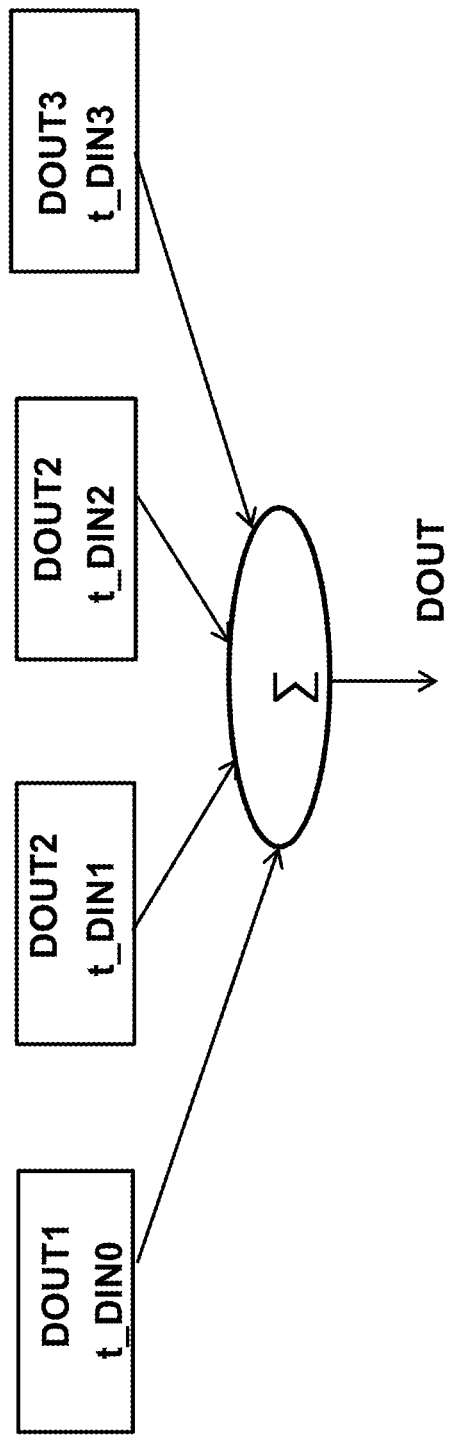
FIG. 35 depicts a digital summer circuit.

A 4-bit input DIN [3:0] for a particular row will cause one analog level out of 16 levels (e.g., VCGIN0, . . . , or VCGIN15) to be selected and applied to the row of the VMM array. This operation operates on 4 data in inputs at the same time. Alternative embodiment is to operate one data in input at a time (input bitwise-operation), the result for each data in put is then added (summed) together by in analog domain (FIG. 33, FIG. 34) or digital domain (FIG. 35, FIG. 39). The result addition is adjusted for binary weight for each input bit if the analog bias levels (VCGIN [15:0]) have the same voltage value for all data in input bits (shifting and add in FIG. 39). If the analog bias level (VCGIN [15:0]) have the voltage values that are equivalent to binary value of the data input bits, then no binary weight adjustment is needed for the data in input bits.

In another embodiment, the input signal to the input block of the array is an exemplary 4-bit input shown in Table 14B for input bit-wise operation (e.g., operation is done for DIN0, then DIN1, then DIN2, then DIN3 input) with a constant analog bias voltage:

TABLE 14B

Exemplary table for 4-bit input with single analog bias level with input bit-wise operation

| DIN3 | DIN2 | DIN1 | DIN0 | VCGIN |
|------|------|------|------|--------|
| 0 | 0 | 0 | 0 | VCGIN1 |
| 0 | 0 | 0 | 1 | VCGIN1 |
| 0 | 0 | 1 | 0 | VCGIN1 |
| 0 | 0 | 1 | 1 | VCGIN1 |
| 0 | 1 | 0 | 0 | VCGIN1 |
| 0 | 1 | 0 | 1 | VCGIN1 |
| 0 | 1 | 1 | 0 | VCGIN1 |
| 0 | 1 | 1 | 1 | VCGIN1 |
| 1 | 0 | 0 | 0 | VCGIN1 |
| 1 | 0 | 0 | 1 | VCGIN1 |
| 1 | 0 | 1 | 0 | VCGIN1 |
| 1 | 0 | 1 | 1 | VCGIN1 |
| 1 | 1 | 0 | 0 | VCGIN1 |
| 1 | 1 | 0 | 1 | VCGIN1 |
| 1 | 1 | 1 | 0 | VCGIN1 |
| 1 | 1 | 1 | 1 | VCGIN1 |

The binary weighted result per input bit DIN will be summed together in the analog domain (such as by using current summer in FIG. 34) or in the digital domain (such as by using the embodiments of FIG. 35 or FIG. 39).

In another embodiment, the input signal to the input block of the array is an exemplary 4-bit input as shown in Table 14C for input multibit-wise operation (e.g., DIN3 and DIN2 together, and DIN1 and DIN0 together) with examples of two analog bias levels:

TABLE 14C

Exemplary table for 4-bit input with analog bias level with input multibit-wise operation

| DIN3 | DIN2 | DIN1 | DIN0 | VCGIN10 for DIN[1:0] | VCGIN32 for DIN[3:2] |
|------|------|------|------|----------------------|----------------------|
| 0 | 0 | 0 | 0 | VCGIN0 | VCGIN0 |
| 0 | 0 | 0 | 1 | VCGIN1 | VCGIN0 |
| 0 | 0 | 1 | 0 | VCGIN2 | VCGIN0 |
| 0 | 0 | 1 | 1 | VCGIN3 | VCGIN0 |
| 0 | 1 | 0 | 0 | VCGIN0 | VCGIN1 |
| 0 | 1 | 0 | 1 | VCGIN1 | VCGIN1 |
| 0 | 1 | 1 | 0 | VCGIN2 | VCGIN1 |
| 0 | 1 | 1 | 1 | VCGIN3 | VCGIN1 |
| 1 | 0 | 0 | 0 | VCGIN0 | VCGIN2 |
| 1 | 0 | 0 | 1 | VCGIN1 | VCGIN2 |
| 1 | 0 | 1 | 0 | VCGIN2 | VCGIN2 |
| 1 | 0 | 1 | 1 | VCGIN3 | VCGIN2 |
| 1 | 1 | 0 | 0 | VCGIN0 | VCGIN3 |
| 1 | 1 | 0 | 1 | VCGIN1 | VCGIN3 |
| 1 | 1 | 1 | 0 | VCGIN2 | VCGIN3 |
| 1 | 1 | 1 | 1 | VCGIN3 | VCGIN3 |

The binary weighted result per multibit DIN [1:0] and DIN [3:2] will be summed together in the analog domain (like current summer in FIG. 34) or digital domain (FIG. 35, FIG. 39).

In another embodiment, the input signal is a hybrid signal comprising an analog bias voltage component added with a pulse component (analog bias supply modulated pulsewidth), as shown in Table 15 for an exemplary 4-bit input with analog bias supply and pulses:

TABLE 15

Exemplary table for hybrid input for 4-bit input with analog bias level and pulses

| DIN3 | DIN2 | DIN1 | DIN0 | VCGIN | TPULSE or PULSES |
|------|------|------|------|--------|------------------|
| 0 | 0 | 0 | 0 | VCGIN1 | 0X |
| 0 | 0 | 0 | 1 | VCGIN1 | 1X |
| 0 | 0 | 1 | 0 | VCGIN1 | 2X |
| 0 | 0 | 1 | 1 | VCGIN1 | 3X |
| 0 | 1 | 0 | 0 | VCGIN1 | 4X |
| 0 | 1 | 0 | 1 | VCGIN1 | 5X |
| 0 | 1 | 1 | 0 | VCGIN1 | 6X |
| 0 | 1 | 1 | 1 | VCGIN1 | 7X |
| 1 | 0 | 0 | 0 | VCGIN2 | 4X |
| 1 | 0 | 0 | 1 | VCGIN2 | 4.5X |
| 1 | 0 | 1 | 0 | VCGIN2 | 5X |
| 1 | 0 | 1 | 1 | VCGIN2 | 5.5X |
| 1 | 1 | 0 | 0 | VCGIN2 | 6X |
| 1 | 1 | 0 | 1 | VCGIN2 | 6.5X |
| 1 | 1 | 1 | 0 | VCGIN2 | 7X |
| 1 | 1 | 1 | 1 | VCGIN2 | 7.5X |

In this hybrid system, the timing for the input pulses is reduced by half as shown in the Table 15. The input data is partitioned into multiple input data-in sets, with each data-in set being assigned to a particular bias level component. For example for an 8-bit input DIN [7:0], input data in data-in set DIN [3:0] receives a row supply VCGIN1, and input data in data-in set DIN [7:4] receives another row voltage supply VCGIN2 that is different than VCGIN1. In this exemplary embodiment of the two binary input set partition, the analog bias supply VCGIN2 (for the second data-in set DIN [7:4]) produces cell current that is 2× the cell current that is produced by the analog bias supply VCGIN1 (for the first data-in set DIN [3:0]), and the pulses for the second data-in set DIN[7:4] is of the same value as the pulses for the first data-in set DIN[3:0]. For example, the ratio of VCGIN2/VCGIN1 is 2× for cells operating in linear region. In a variation of this embodiment, 2 partitions for the input data-in sets, each corresponding to a different analog bias voltage. For example, there could be 4 partitions, each with a different VCCGIN bias level to reduce the width of the requisite input pulses by a factor of 4.

With reference again to FIG. 39, output block 3900 then receives the output current, ICELL, from VMM in response to the input din_n. D/A converter 3902 converts ICELL into digital form, dout_n, that represents the digital value of the output generated in response to din_n, where each dout_n is a set of one or more bits.

Shifter 3903, adder 3904, and register 3905 operate to apply a different weight to each output, DOUT_n, that is generated in response to each input bit, DIN_n. In the simple example where n=4, shifter 3902, adder 3904, and register 3905 would perform the following actions:

(1) in response to DIN_0, shifter 3903 would receive DOUT_0 and would not shift it, to yield the result of (1);

(2) in response to DIN_1, shifter 3903 would receive DOUT_1 and shift it one bit to the left, and adder would add the result to the result of (1) to yield the result of (2);

(3) in response to DIN_2, shifter 3903 would receive DOUT_2 and shift it two bits to the left, and adder 3904 would add the result to the result of (2) to yield the result of (3);

(4) in response to DIN_3, shifter would receive DOUT_3 and shift it three bits to the left, and adder 3904 would add the result to the result of (3) to yield the result of (4), the final result In the case the DIN [n:0] inputs are combined with the analog voltage level such as to represent for the binary weight of each data input, only adding is needed, without shifting for this hybrid input bitwise-operation. Output register 3905 would output the result of (4) as DOUT.

FIG. 35 depicts digital summer 3500, which receives a plurality of digital values, sums them together and generates an output DOUT representing the sum of the inputs. Digital summer 3500 can be used during a verify operation. As shown for an example of a 4-bit digital value, there are digital output bits to hold the value from 4 evaluation pulses, where the values are summed up at the end of the process. The digital outputs are digitally scaled based on the $2^n*DINn$ bit position, for example, DOUT3=x8 DOUT0, _ DOUT2=x4 DOUT1, I_DOUT1=x2 DOUT0, I_DOUT0=DOUT0.

Figure 36A:
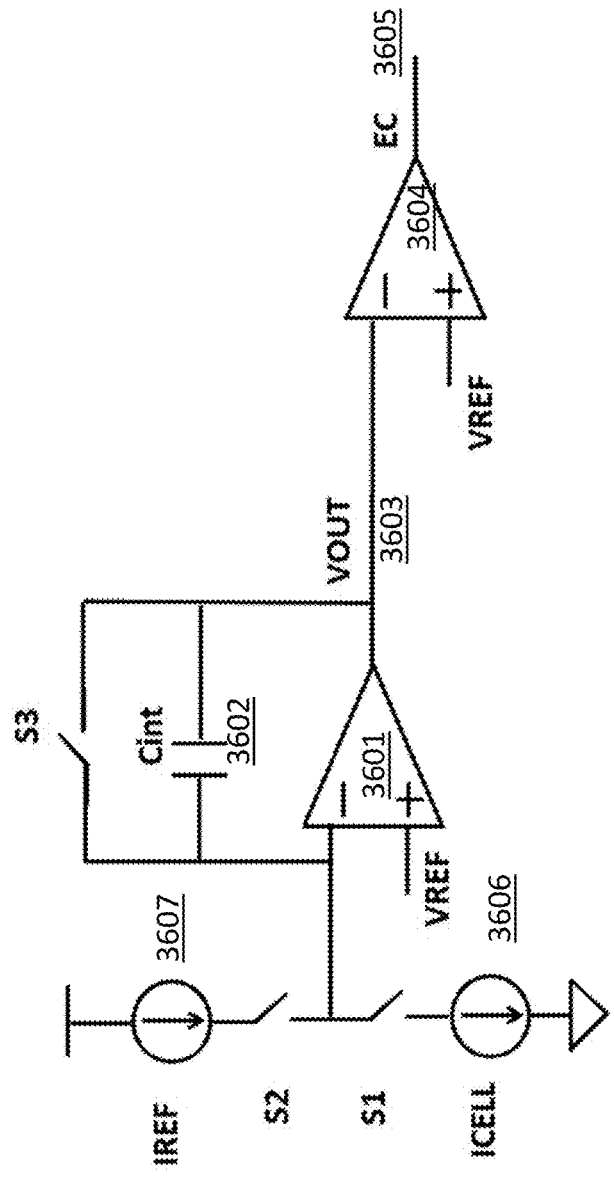
FIG. 36A depicts an embodiment of an integrating analog-to-digital converter for a neuron output.
Figure 36B:
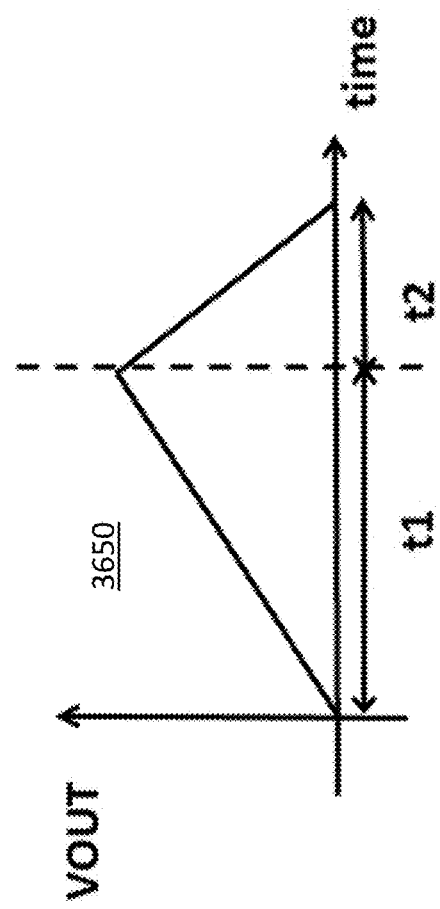
FIG. 36B depicts a graph showing the voltage output over time of the integrating analog-to-digital converter of FIG. 36A.

FIG. 36A shows an integrating dual-slope ADC 3600 applied to an output neuron to convert the cell current into digital output bits. An integrator consisting of integrating op-amp 3601 and integrating capacitor 3602 integrates a cell current ICELL versus a reference current IREF. As shown in FIG. 36B, during a fixed time t1, the cell current is up integrated (Vout rises), and then a reference current is applied to down integrated for a time t2 (Vout falls). The current Icell is =t2/t1*IREF. For example, for t1, for 10 bit digital bits resolution, 1024 cycles are used, and the cycle number for t2 varies from 0 to 1024 cycles depending on the Icell value.

Figure 36C:
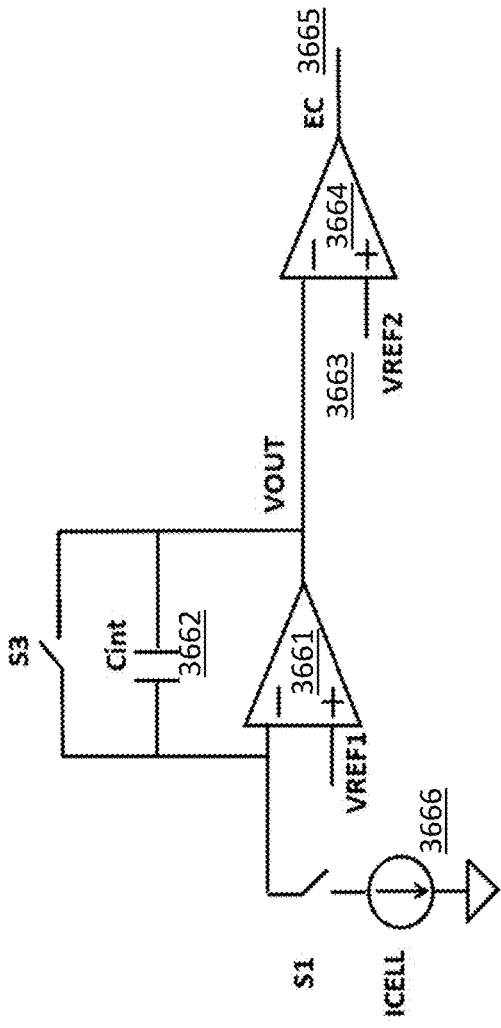
FIG. 36C depicts another embodiment of an integrating analog-to-digital converter for a neuron output.
Figure 36D:
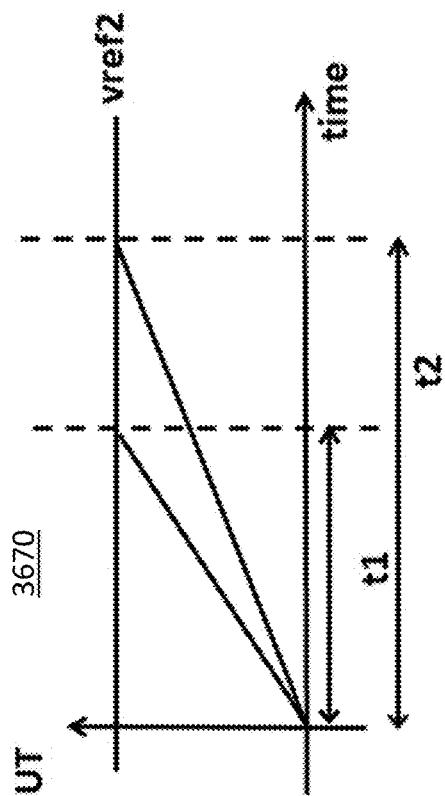
FIG. 36D depicts a graph showing the voltage output over time of the integrating analog-to-digital converter of FIG. 36C.

FIG. 36C shows integrating single slope ADC 3660 applied to an output neuron to convert the cell current into digital output bits. An integrator consisting of integrating op-amp 3661 and integrating capacitor 3662 integrates a cell current ICELL. As shown in FIG. 36D, during a time t1, a cell current is up integrated (Vout rises until it reaches Vref2), and during time t2, another cell current is up integrated. The cell current I cell=Cint*Vref2/t. A pulse counter is used to count the number of pulses (digital output bits) during integration time t. For example as shown digital output bits for t1 is less than that of t2, meaning the cell current during t1 is larger the cell current during t2 integration. An initial calibration is done to calibrate the integrating capacitor value with a reference current and a fixed time, Cint=Tref*Iref/Vref2.

Figure 36E:
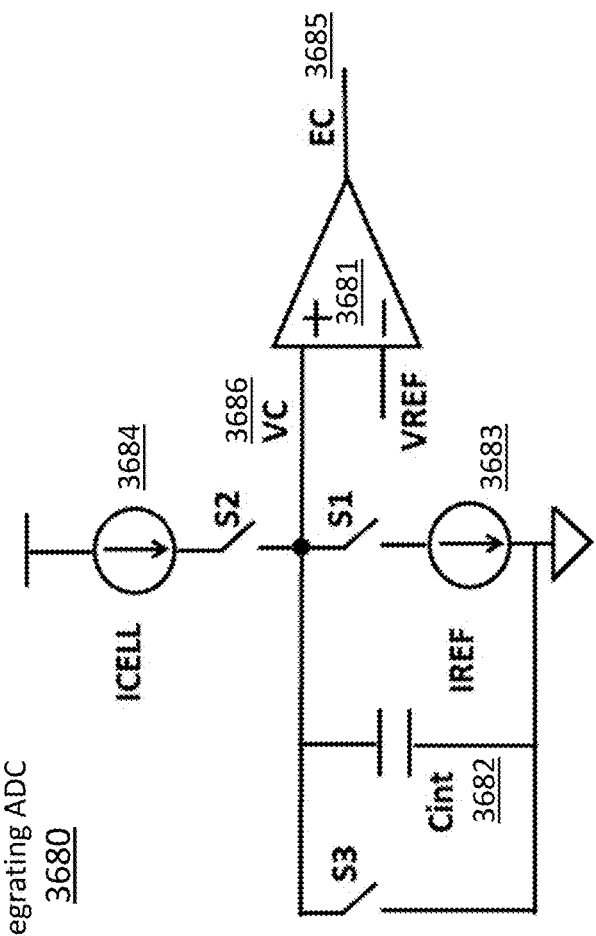
FIG. 36E depicts another embodiment of an integrating analog-to-digital converter for a neuron output.

FIG. 36E shows integrating dual slope ADC 3680 applied to an output neuron to convert the cell current into digital output bits. The integrating dual slope ADC 3680 does not utilize an integrating op-amp. The cell current or the reference current is integrated directly on the capacitor 3682. A pulse counter is used to count pulses (digital output bits) during integration time. The current Icell is =t2/t1*IREF.

Figure 36F:
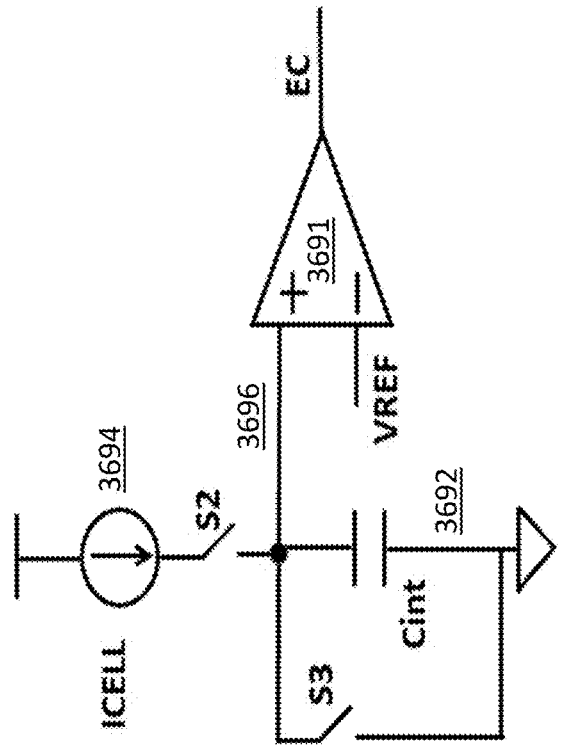
FIG. 36F depicts another embodiment of an integrating analog-to-digital converter for a neuron output.

FIG. 36F shows integrating single slope ADC 3690 applied to an output neuron to convert the cell current into digital output bits. The integrating single slope ADC 3680 does not utilize an integrating op-amp. The cell current is integrated directly on the capacitor 3692. A pulse counter is used to count pulses (digital output bits) during integration time. The cell current I cell=Cint*Vref2/t.

Figure 37A:
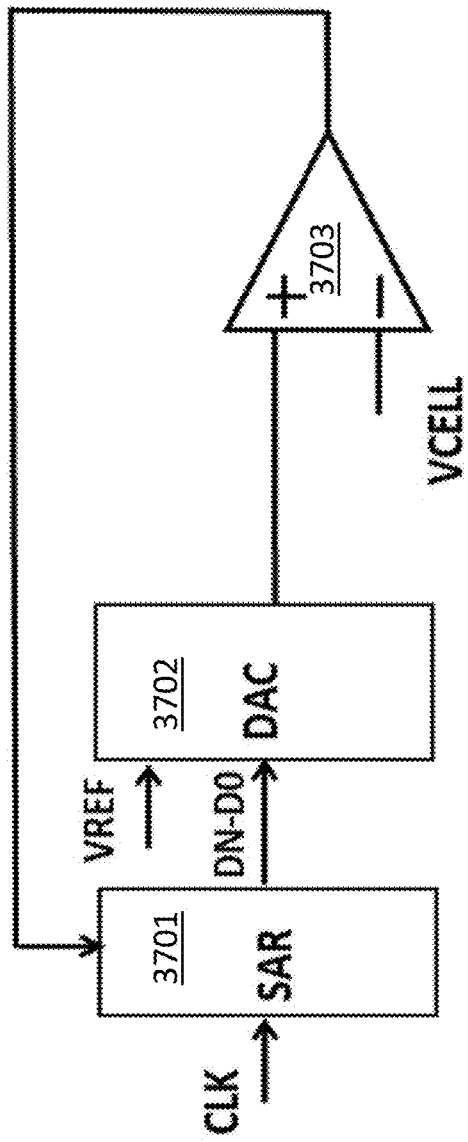
FIGS. 37A and 37B depict a successive approximation analog-to-digital converter for a neuron output.
Figure 37B:
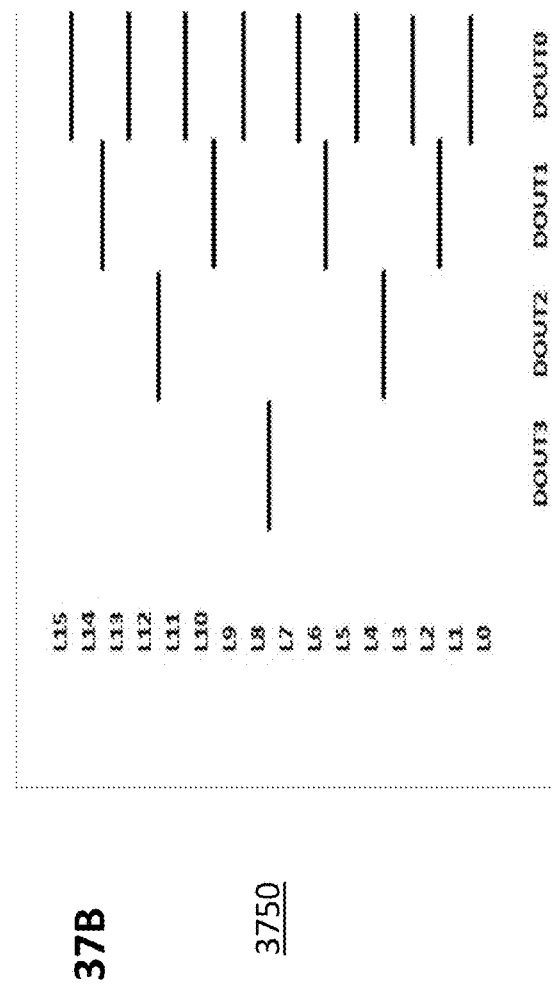

FIG. 37A shows a SAR (Successive Approximation Register) ADC applied to an output neuron to convert a cell current into digital output bits. Cell current can be dropped across a resistor to convert into a VCELL. Alternatively, the cell current can charge up a S/H capacitor to convert into a VCELL. A binary search is used to compute the bit starting from MSB bit (most significant bit). Basing on the digital bits from SAR 3701, DAC 3702 is used to set appropriate analog reference voltage to comparator 3703. The output of the comparator 3703 in turns feedback to SAR 3701 to choose the next analog level. As shown in FIG. 37B, for the example of 4-bit digital output bits, there are 4 evaluation periods: a first pulse to evaluate DOUT3 by setting an analog level half-way, then a second pulse to evaluate DOUT2 by setting an analog level half way of the top-half or half way of the bottom-half, etc.

Figure 38:
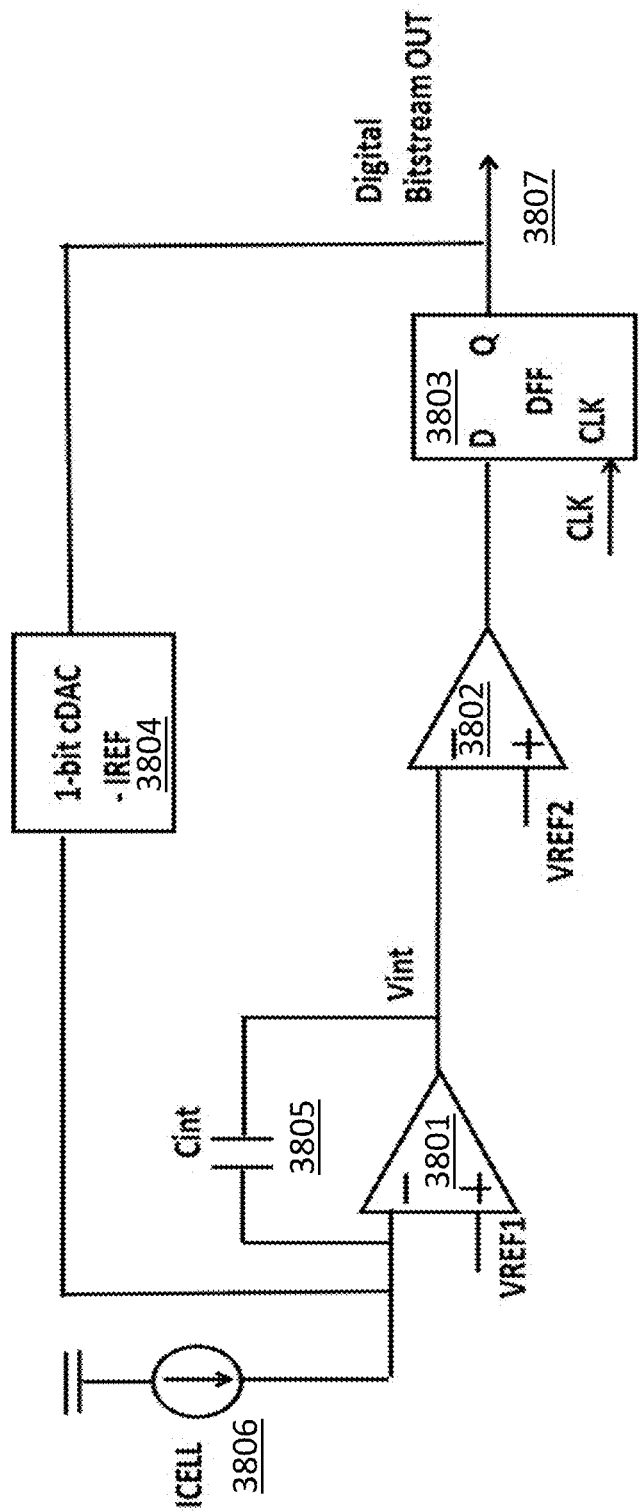
FIG. 38 depicts an embodiment of a sigma delta analog-to-digital converter.

FIG. 38 shows sigma delta ADC 3800 applied to an output neuron to convert a cell current into digital output bits. An integrator consisting of op-amp 3801 and capacitor 3805 integrates the summation of current from a selected cell current and a reference current resulting from 1-bit current DAC 3804. A comparator 3802 compares integrating output voltage versus a reference voltage. The clocked DFF 3803 provides digital output streams depending on the output of the comparator 3802. The digital output stream typically goes to a digital filter before outputting into digital output bits.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
providing a plurality of input bits to an input circuit sequentially to an array of non-volatile memory cells;
for each of the plurality of input bits:
generating, by the input circuit, an input signal in response to the input bit;
applying the input signal to a terminal of a selected non-volatile memory cell in the array;
receiving, by an output circuit from the array, an output generated in response to the input bit;
converting the output into a digital output; and
shifting the digital output based on the bit location of the input bit within the plurality of input bits to generate a shifted result; and
adding the shifted results for all of the plurality of input bits to yield a digital output.

2. The method of claim 1, wherein the selected non-volatile memory cell is a split-gate flash memory cell.

3. The method of claim 2, wherein the terminal is a control gate terminal.

4. The method of claim 1, wherein the selected non-volatile memory cell is part of a neural memory.

5. The method of claim 1, wherein the input signal comprises a pulse.

6. The method of claim 1, wherein the input signal comprises an analog bias signal.

7. The method of claim 1, wherein the input signal comprises an analog bias signal and a pulse.

8. The method of claim 7, wherein one of the plurality of input bits is coded as the analog bias signal.

9. A method comprising:
providing a plurality of input bits to an input circuit sequentially to an array of non-volatile memory cells; and
for each of the plurality of input bits:
generating, by the input circuit, an input signal in response to the input bit, wherein the input signal comprises an analog bias level component and a pulsewidth component;
applying the input signal to a terminal of a selected non-volatile memory cell in the array;
receiving, by an output circuit, an output generated in response to the input bit; and
converting the output into a digital output.

10. The method of claim 9, further comprising:
shifting the digital output based on the bit location of the input bit within the plurality of input bits to generate a shifted result; and
adding the shifted results for all of the plurality of input bits to yield a digital output.

11. The method of claim 9, wherein the output is generated using a current summer.

12. The method of claim 9, wherein the analog bias level component is a binary weighted value.

13. The method of claim 9, wherein the output value is generated based only on the pulsewidth modulation input.

14. The method of claim 9, wherein the selected non-volatile memory cell is part of a neural memory.

15. A method comprising:
providing a plurality of input bits to an input circuit sequentially to an array of non-volatile memory cells; and
for each of the plurality of input bits:
generating, by the input circuit, an input signal in response to the multi-bits of the input bits, wherein the input signal is an analog bias level;
applying the input signal to a terminal of a selected non-volatile memory cell in the array; and
receiving, by an output circuit, an output generated in response to the input bit.

16. The method of claim 15, further comprising:
converting the output into a digital output.

17. The method of claim 16, further comprising:
adding the results for all of the plurality of input bits to yield a digital output.

18. The method of claim 16, further comprising:
shifting the digital output based on the bit location of the input bit within the plurality of input bits to generate a shifted result; and
adding the shifted results for all of the plurality of input bits to yield a digital output.

19. The method of claim 17, wherein the output is generated using a current summer.

20. The method of claim 15, wherein the analog bias level is binary indexed value.

21. The method of claim 15, wherein the analog bias level is such that resulting cell output value is output value is generated based only on the pulsewidth modulation input.

22. The method of claim 15, wherein the selected non-volatile memory cell is part of a neural memory.

* * * * *